United States Patent
Silverbrook

(12) 
(10) Patent No.: US 7,132,679 B2
(45) Date of Patent: Nov. 7, 2006

(54) SINGLE WALL CARBON NANOTUBE ELECTRONIC DEVICES

(75) Inventor: Kia Silverbrook, 393 Darling Street, Balmain, NSW 2041 (AU)

(73) Assignee: Kia Silverbrook, Balmain (AU)

( * ) Notice: Subject to any disclaimer, the term of this patent is extended or adjusted under 35 U.S.C. 154(b) by 555 days.

(21) Appl. No.: 10/428,823

(22) Filed: May 5, 2003

(65) Prior Publication Data

US 2004/0009648 A1 Jan. 15, 2004

Related U.S. Application Data

(62) Division of application No. 09/646,927, filed as application No. PCT/AU99/00204 on Mar. 24, 1999, now Pat. No. 6,593,166.

(30) Foreign Application Priority Data

Mar. 24, 1998  (AU) ............................................... PP2563
Mar. 24, 1998  (AU) ............................................... PP2564

(51) Int. Cl.
*H01L 51/00* (2006.01)

(52) U.S. Cl. .......................... 257/40; 438/99; 427/227; 427/592; 428/408

(58) Field of Classification Search .................. 438/99; 427/277, 592; 219/121.6; 313/311, 524; 428/408
See application file for complete search history.

(56) References Cited

U.S. PATENT DOCUMENTS

| 5,223,479 | A |   | 6/1993  | McCauley, Jr. et al. |
| 6,059,627 | A | * | 5/2000  | Dean et al. ................. 313/311 |
| 6,083,624 | A | * | 7/2000  | Hiura ......................... 428/408 |
| 6,203,864 | B1 | * | 3/2001 | Zhang et al. ............... 427/592 |
| 6,210,800 | B1 |   | 4/2001 | Nesper et al. |
| 6,225,198 | B1 |   | 5/2001 | Alvisatos et al. |
| 6,306,736 | B1 |   | 10/2001 | Alivisatos et al. |
| 6,331,690 | B1 | * | 12/2001 | Yudasaka et al. ........ 219/121.6 |
| 6,350,488 | B1 |   | 2/2002 | Lee et al. |
| 6,559,550 | B1 | * | 5/2003 | Herman ..................... 290/1 R |
| 6,593,166 | B1 |   | 7/2003 | Silverbrook |
| 6,667,572 | B1 | * | 12/2003 | Lewis ........................ 313/524 |

FOREIGN PATENT DOCUMENTS

| JP | 07172807 A | 7/1995 |
| WO | WO 95/00440 A | 1/1995 |

\* cited by examiner

*Primary Examiner*—Kevin M. Picardat

(57) ABSTRACT

The present invention provides electrical devices having controlled electrical properties and being formed from nanotube components, together with a method of constructing the devices. In one example, the electrical device is formed from the central nanotube of a zigzag type interconnected between two nanotubes of an armchair type. The method of forming the nanotube structure includes connecting a first end of a zig-zag type nanotube to an end of an armchair type nanotube, and connecting a second end of the zig-zag type nanotube to an end of a second armchair type nanotube.

16 Claims, 36 Drawing Sheets

Synthesis of 'hub' fragments

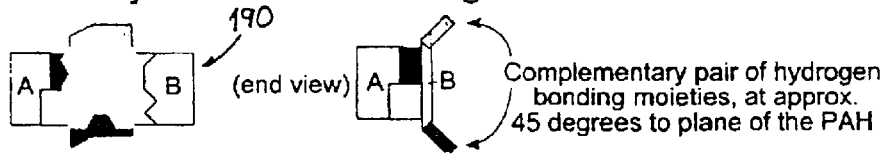

Complementary pair of hydrogen bonding moieties, at approx. 45 degrees to plane of the PAH

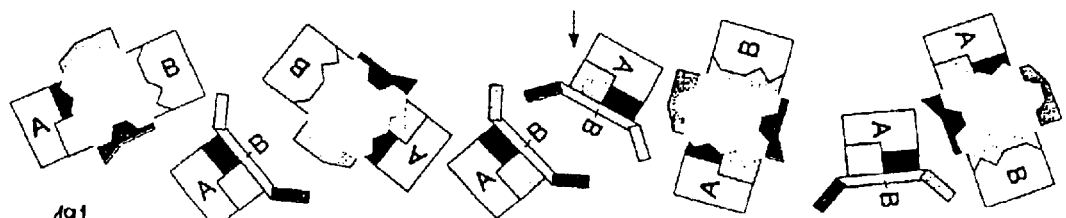

Heat the solution, to a temperature sufficient to disrupt the hydrogen bonds, but insufficient to denature any covalent bonds.

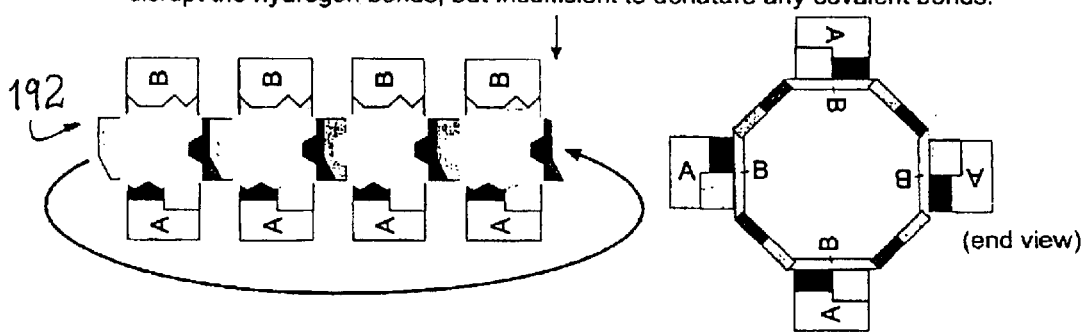

Slowly reduce the temperature to a temperature where the hydrogen bonds are highly stable. This process anneals the fragments to their optimum configuration.

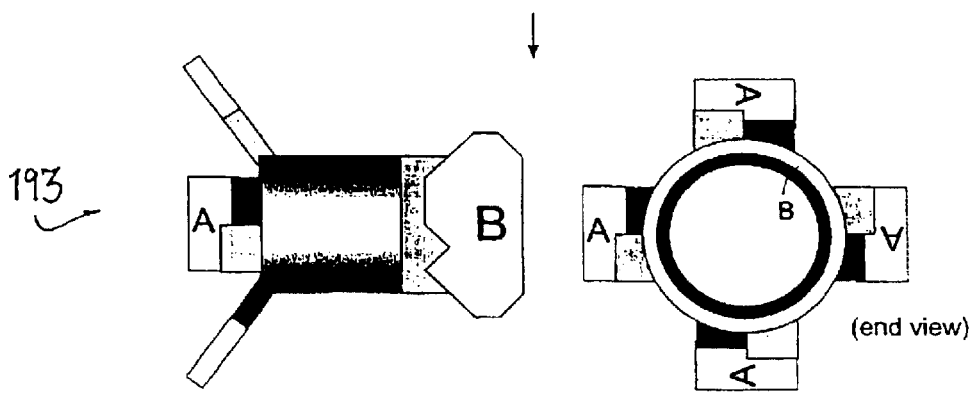

Add a reagent to cause ring closure. Optionally dehydrogenate. Purify.

SINGLE WALL CARBON NANOTUBE ELECTRONIC DEVICES

This application is a Divisional of U.S. patent Ser. No. 09/646,927, filed Nov. 20, 2000, now U.S. Pat. No. 6,593,166, which is a National Stage application of PCT/AU99/00204, filed Mar. 24, 1999.

FIELD OF THE INVENTION

The present invention relates to the creation of complex material and/or electronic structures and, in particular, discloses the creation of a nanotube matrix material.

BACKGROUND OF THE INVENTION

The use of materials in a mechanical manner and electronic is fundamental to society. Different materials such as steel and carbon fibre are well sought after for their mechanical strength to weight characteristics.

Additionally, new materials having new improved properties are always desirable. Also materials having unique electrical properties are also highly desirable where they have a high degree of utility.

Further, in recent years, a huge industry has been created in the fabrication of integrated circuit type devices on silicon wafers etc. Huge research investments continue to be made in the continued muniturization of electronic circuits and the building up of complex 3 dimensional structures layer by layer on a semiconductor wafer.

In 1991, Sumio Iigima reported the discovery of carbon nanotube type devices. The discovery of carbon nanotubes has been recognised as a new fascinating material with nanometre dimensions and promising exciting new areas of carbon chemistry and physics.

For a series of background articles on the application of carbon nanotube type devices, reference is made to the text "carbon nanotubes" edited by Endo, Iigima and Dressel.

Haus published 1996 by Elsevier Science Limited. The publication contained a number of survey articles covering the field.

Unfortunately, the construction of nanotube type devices proceeds in a somewhat haphazard and uncontrolled manner. Nanotubes are known to be formed in a DC arc discharge or the catalytic composition of acetylene in the presence of various supported transition metal catalysts.

Unfortunately, such arrangements tend to lead to disordered forms of carbon nanotubes which limits their utility through the limitation of the ability to construct complex devices from the nanotubes.

SUMMARY OF THE INVENTION

In accordance with a first aspect the present invention provides an electrical device having controlled properties comprising a central nanotube of a zigzag type interconnected between two nanotubes of an armchair type.

The electrical device can have controlled resistive properties, the central nanotube having a predetermined length.

The electrical device can have signal amplification properties and can comprise field application means for applying a field to said central nanotube, thereby altering the conductive path between said armchair type nanotubes.

The electrical device can have signal amplification properties and comprise a control nanotube of a zigzag type interconnect to said central nanotube, said control nanotube being interconnected to a field application means for applying a voltage to said central nanotube, thereby altering the conductive path between said armchair type nanotubes.

In accordance with the a further aspect, the present invention provides an electrical device comprising a series of nanotubes interconnected at a common junction, said nanotubes, at said junction, comprising zigzag nanotubes, and a predetermined number of said nanotubes comprising a circumferential join to an armchair type nanotube so as to provide for the operational characteristics of said device.

Usually at least one of said armchair type nanotubes are further interconnected to a common junction of armchair type nanotubes.

In accordance with the a further aspect, the present invention provides an electrical device comprising a series of armchair type nanotubes interconnected to a common junction.

In accordance with the a further aspect, the present invention provides an electrical device comprising the interconnection of a labyrinth of nanotube devices via common junctions, said devices comprising a series of diode elements formed from the interconnection of nanotubes of different dimensions.

In accordance with the a further aspect, the present invention provides an electrical device comprising a quantum well structure comprising the junction of a series of metallic type nanotube structures attached to a semiconductive nanotube so that electrons are substantially captured in said junction.

In accordance with the a further aspect, the present invention provides an electric device comprising a ballistic electron nanotube device comprising a nanotube junction with at least one quantum well structure adjacent the junction.

In accordance with the a further aspect, the present invention provides a method of forming an electrical device having controlled properties, the method comprising connecting a first end of a zig-zag type nanotube to an end of an armchair type nanotube; and, connecting a second end of the zig-zag type nanotube to an end of a second armchair type nanotube.

The method of connecting a first end of the zig-zag type nanotube to a first end of an armchair type nanotube can comprise synthsising armchair and zig-zag type nanotubes; de-protecting a first end of the armchair and zig-zag type nanotubes; and interconnecting the de-protected ends of the zig-zag and armchair type nanotubes.

The method of interconnecting the de-protected ends can comprise the steps of (a) bringing a series of zig-zag and armchair type nanotubes together in a collation; (b) agitating a first collation to an average energy exceeding a first intermediate binding potential energy; (c) slowly lowering said average energy to a level substantially at said first intermediate binding potential energy; and, (d) introducing a catalytic element to said collation to cause said de-protected ends to bind at a substantially lower second potential energy.

The method can further comprise iteratively repeating steps (a) to (d).

The first intermediate binding potential energy can comprise substantially hydrogen bonding of said de-protected ends and said second lower potential energy can comprise covalent bonding of said de-protected ends.

The said agitating step can comprise heating or ultrasonically agitating said collation.

BRIEF DESCRIPTION OF THE DRAWINGS

Notwithstanding any other forms which may fall within the scope of the present invention, preferred forms of the invention will now be described, by way of example only, with reference to the accompanying drawings in which:

FIG. 32 illustrates an alternative form of formation of a nanotube crystal array hub component starting material;

DESCRIPTION OF PREFERRED AND OTHER EMBODIMENTS

The preferred embodiment discloses a method of manufacture of complex nanotube matrix arrays from intermediate components. Whilst particular descriptions will be given, it will be evident to those skilled in the art that the teachings of the preferred embodiment can be extended to the construction of arbitrary nanotube type devices made up of the placement of components at arbitrary locations.

The electronic devices can include diodes, transistors, resistors etc of a 3-Dimensional form. A number of these devices will now be discussed with reference to FIG. 1 to FIG. 17.

Figure 1:
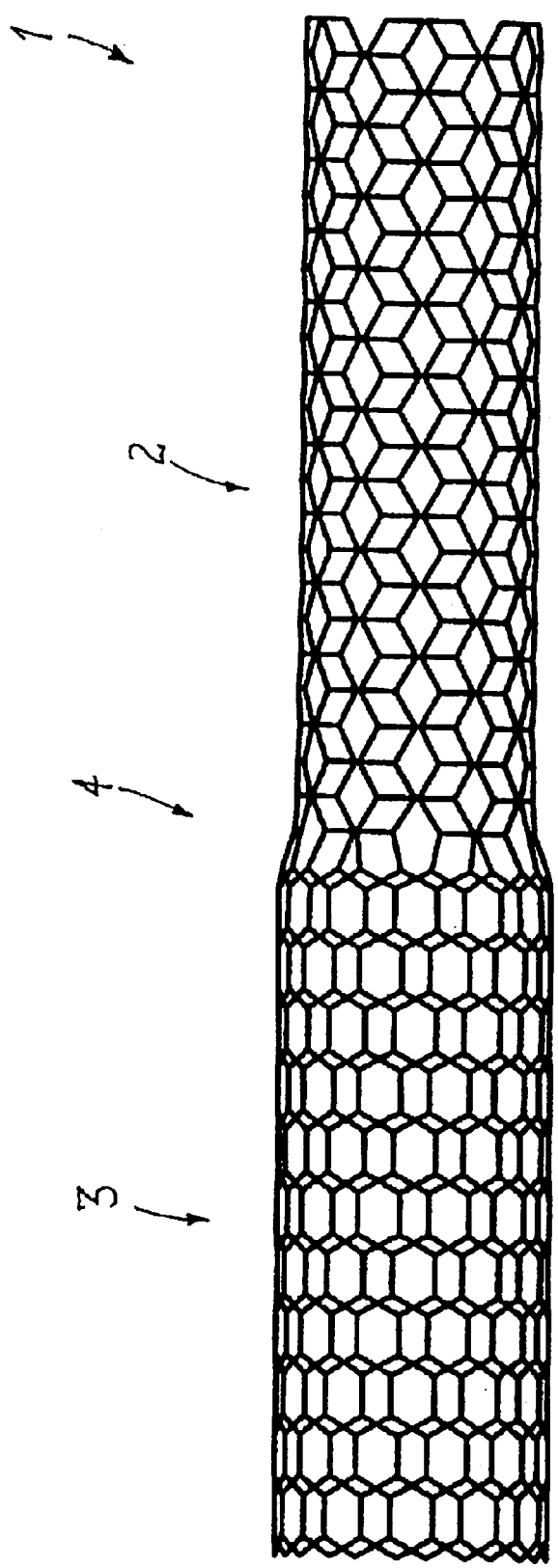
FIG. 1 illustrates a carbon nanotube diode formed by a linear junction between armchair and zigzag nanotubes.

In FIG. 1, there is illustrated a nanotube fragment 1 which includes an "armchair" nanotube 2 interconnected to a zigzag type nanotube wherein at the junctions 4 a diode structure is formed. This results of uneven charged distribution around the junction 3 allowing the device to operate as a diode.

Figure 2:
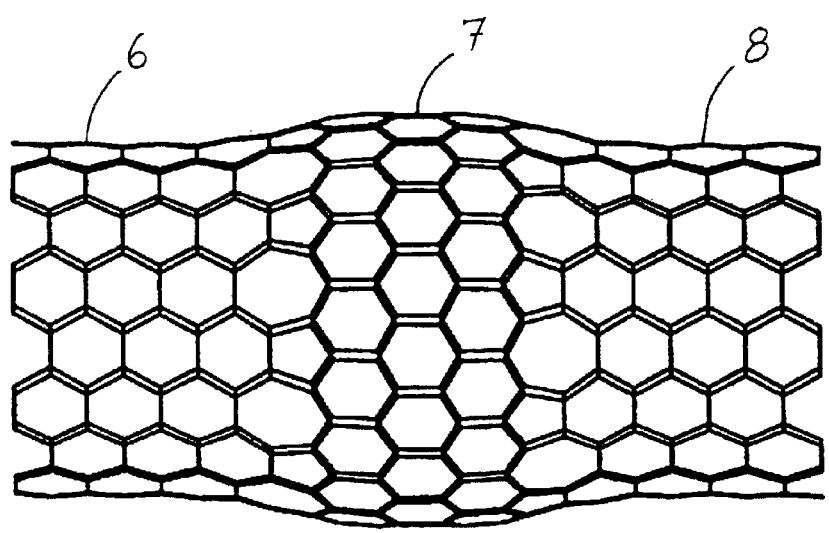
FIG. 2 and FIG. 3 illustrate a nanotube resistive element.
Figure 3:
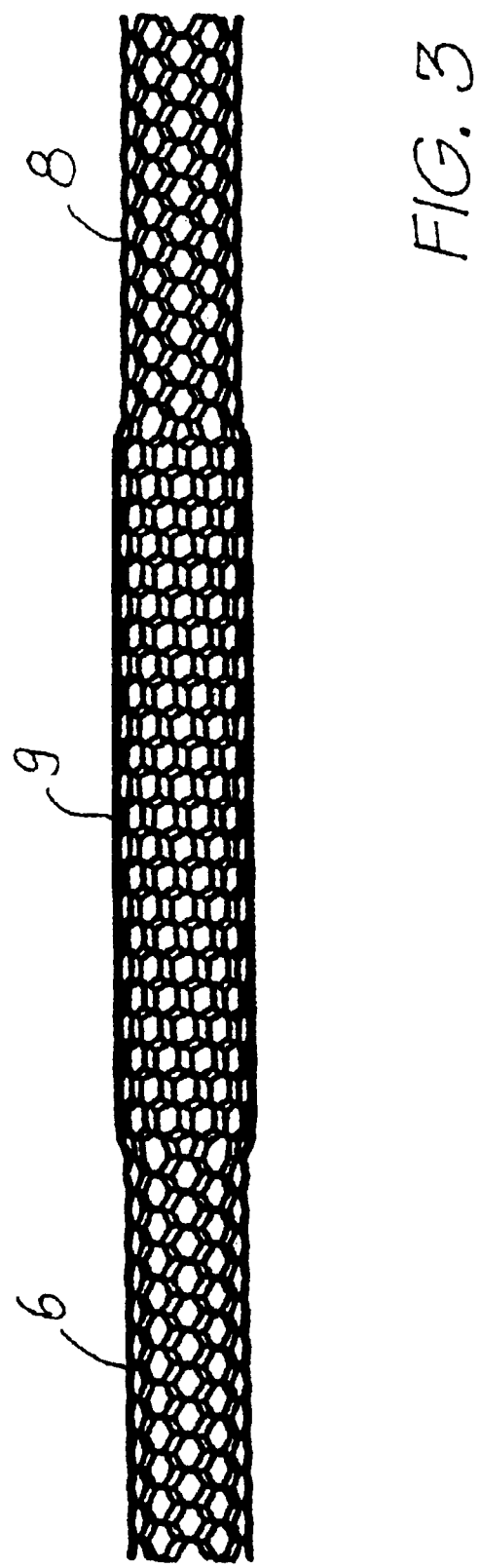

In FIGS. 2 and 3, there is illustrated a tunnelling resistor type device which can be formed from two armchair type nanotubes 6,8 surrounding a central zigzag type nanotube of various lengths 7,9. The breakdown voltage of the arrangement of FIGS. 2 and 3 is approximately two volts when carbon nanotubes are utilized in about 6 volts when boron-nitride nanotubes are utilized.

Figure 4:
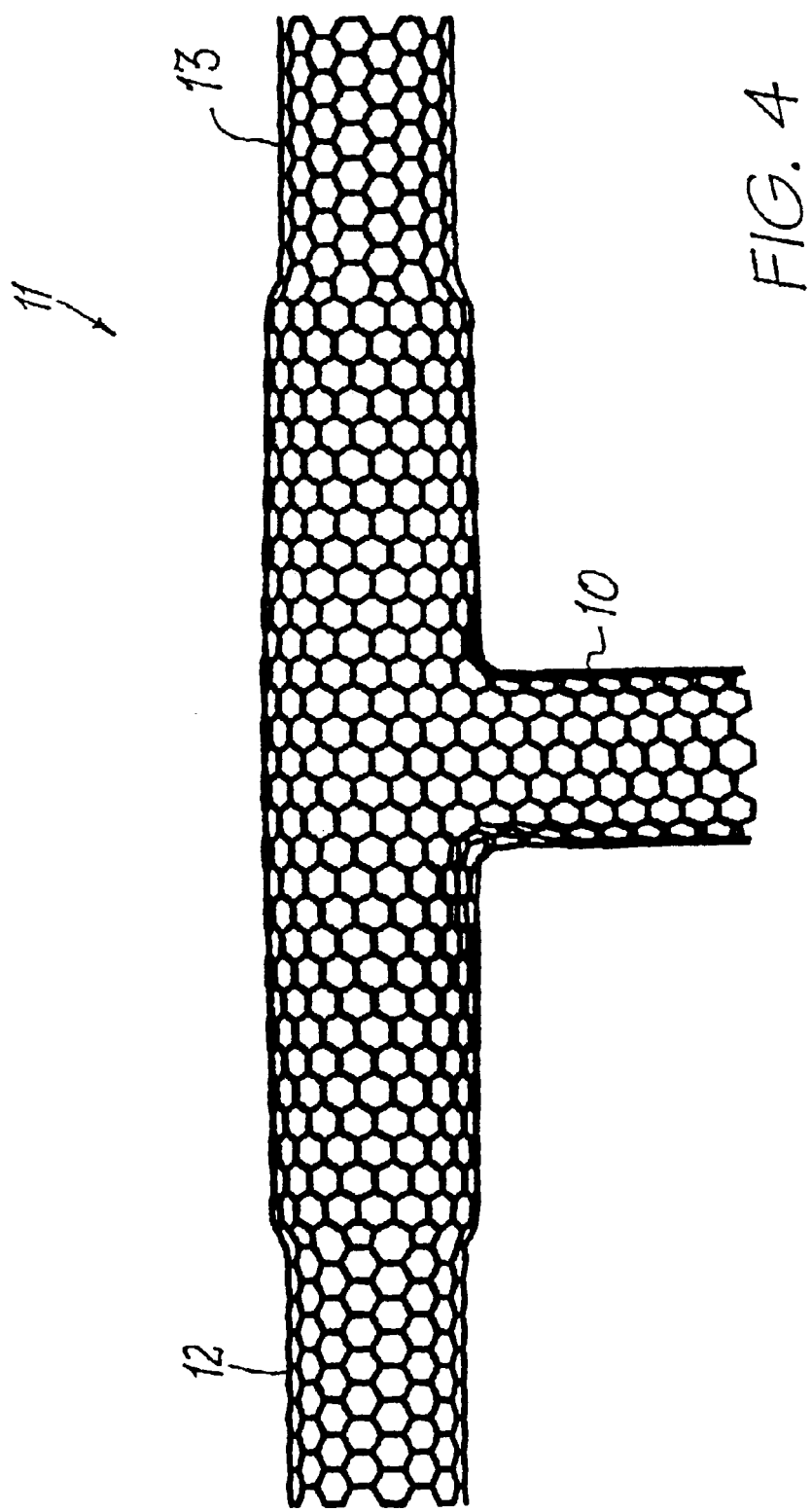
FIG. 4 illustrates a nanotube bipolar type element.

Turning to FIG. 4, there is illustrated a bipolar type transistor 11 which is similar to the structure of FIG. 3 but for the inclusion of a third arm 10 which can be electrically driven to a state so as to control the current flow along the other arms 12,13.

The bipolar type transistor 11 of FIG. 4 is normally non conductive of ballistic transistors due to a band gap mismatch. The application of a voltage potential via the junction 10 results in a band shifting resulting in band gap matching for ballistic transport. The application of potential via arm 10 will also result in a leakage current.

Figure 5:
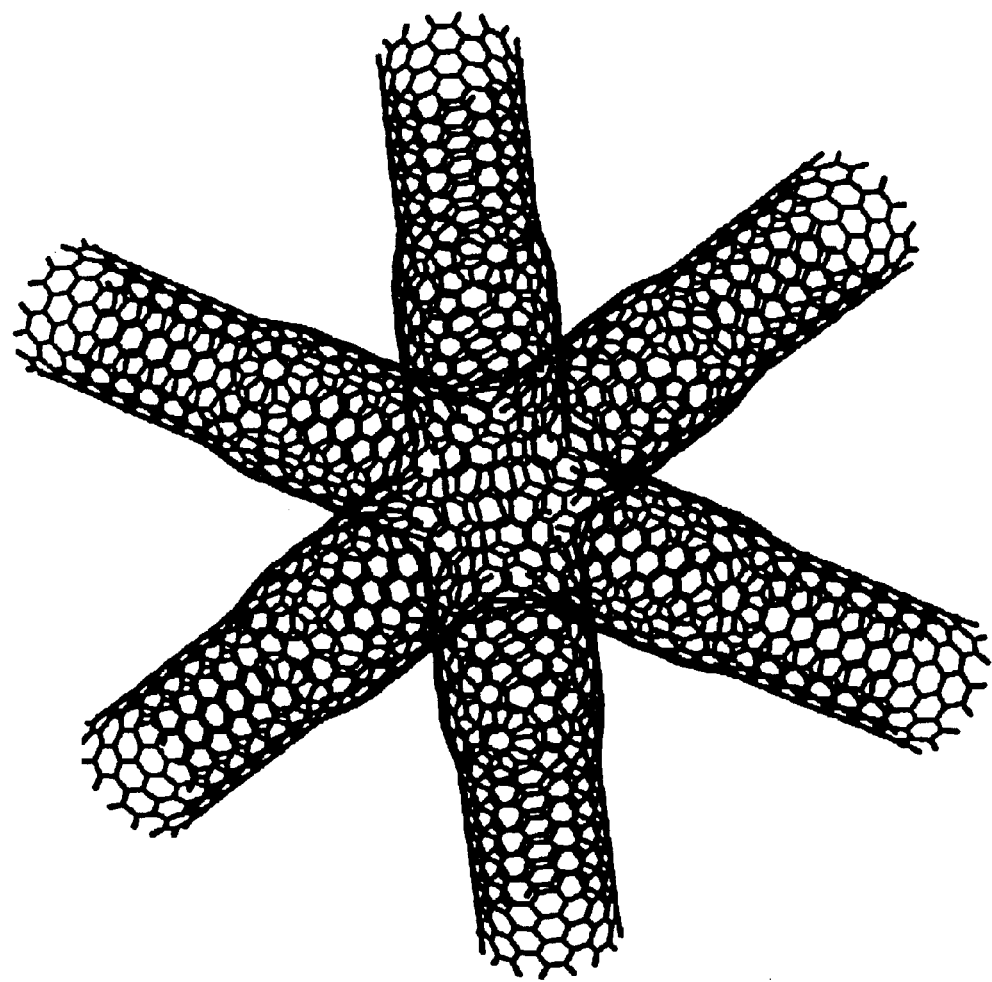
FIG. 5 to FIG. 7 illustrate various views of a core building block for building cubic nanotube structures.
Figure 6:
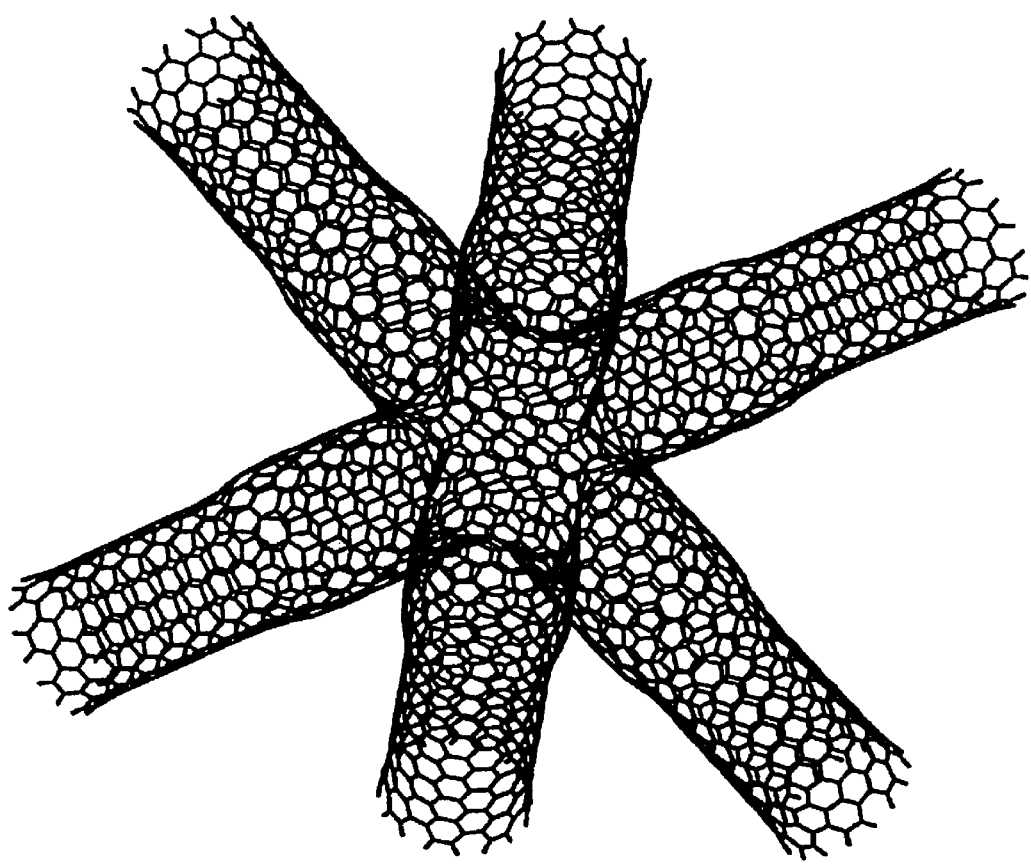
Figure 7:
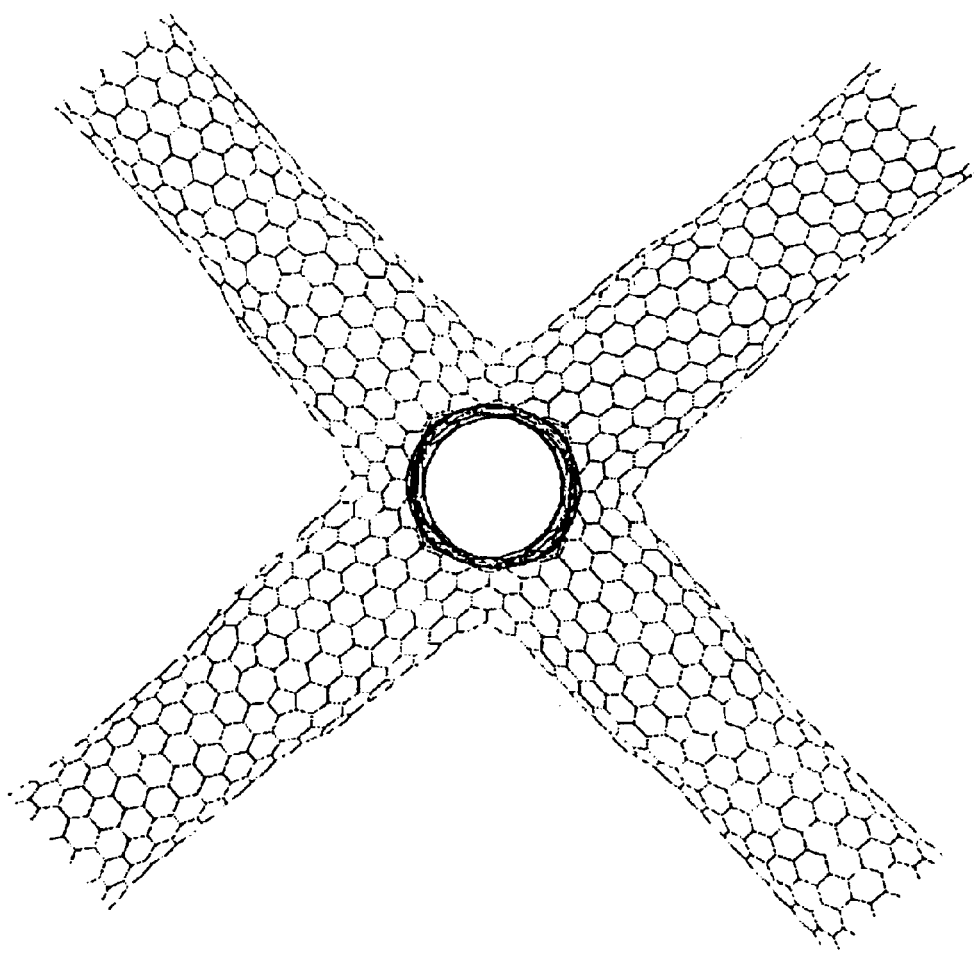
Figure 8:
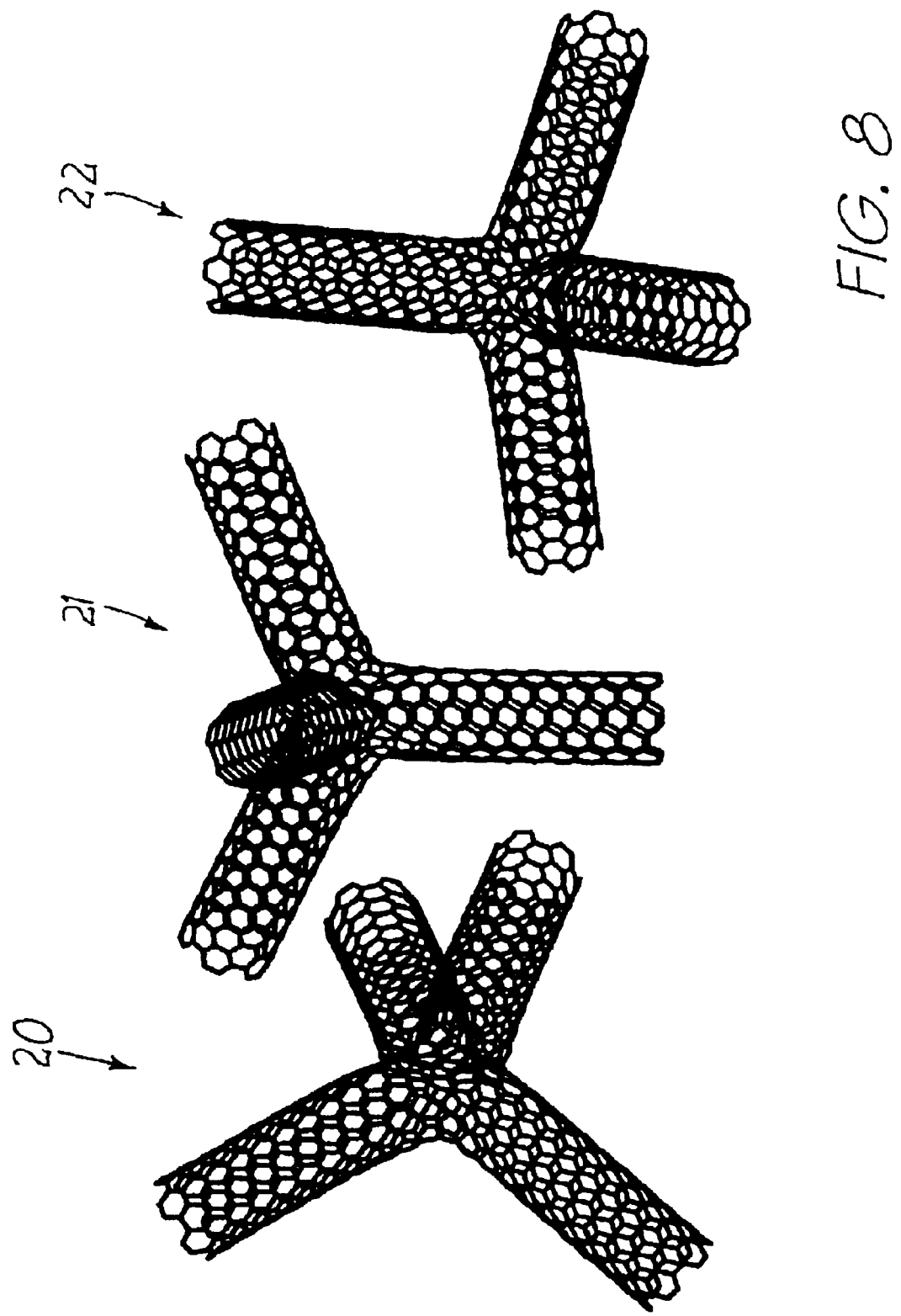
FIG. 8 illustrates a core building block for building tetrahedral structures.
Figure 9:
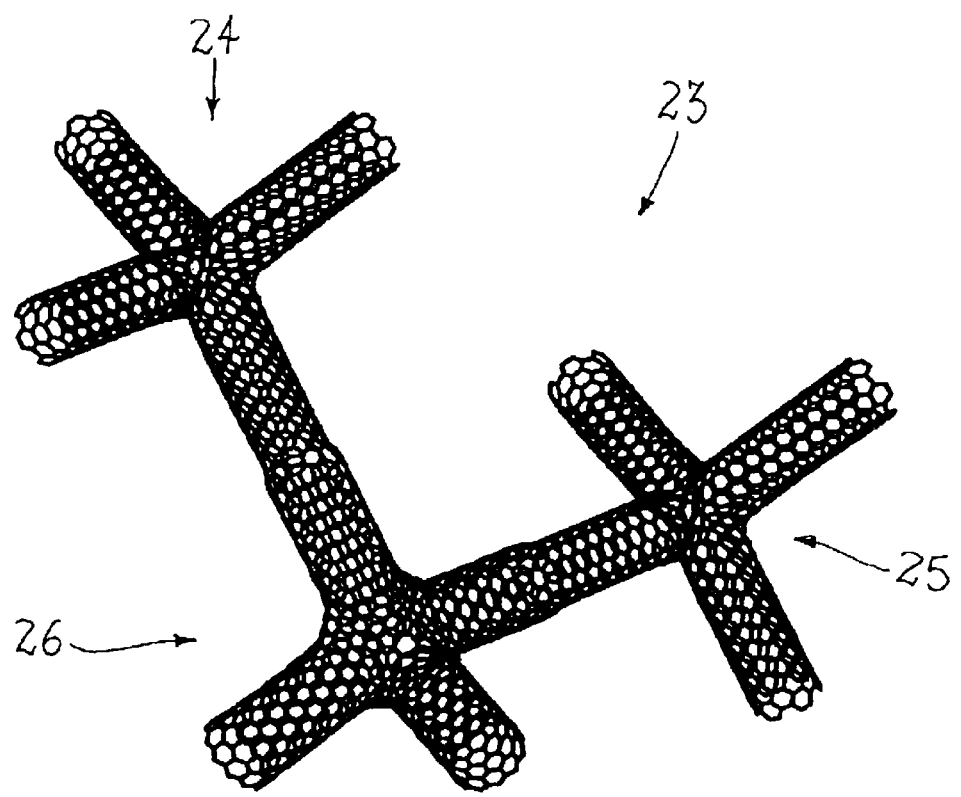
FIG. 9 illustrates a portion of a tetrahedral structure.

The transistor complex of FIG. 4 can be extended to a network complex. Turning to FIG. 5 to FIG. 7, there is shown a basic element of the network complex which includes a set of six back to back diodes. Of course, other forms of arms can be formed so as to provide for direct connections, diodes, quantum dots etc. The network element shown in different views in FIG. 5 to FIG. 7 can be utilised in a cubic network matrix. Of course, other network matrices are possible. For example, in FIG. 8, there is shown a tetrahedral type components 20–22 which can be used to form a corresponding matrix 23 as illustrated in FIG. 9. The matrix arrangement includes conducting pathways 24,25 and transistor element 26. The arrangement 23 of FIG. 9 being further constructed into a tetrahedral mesh in accordance with circuitry requirements.

Figure 10:
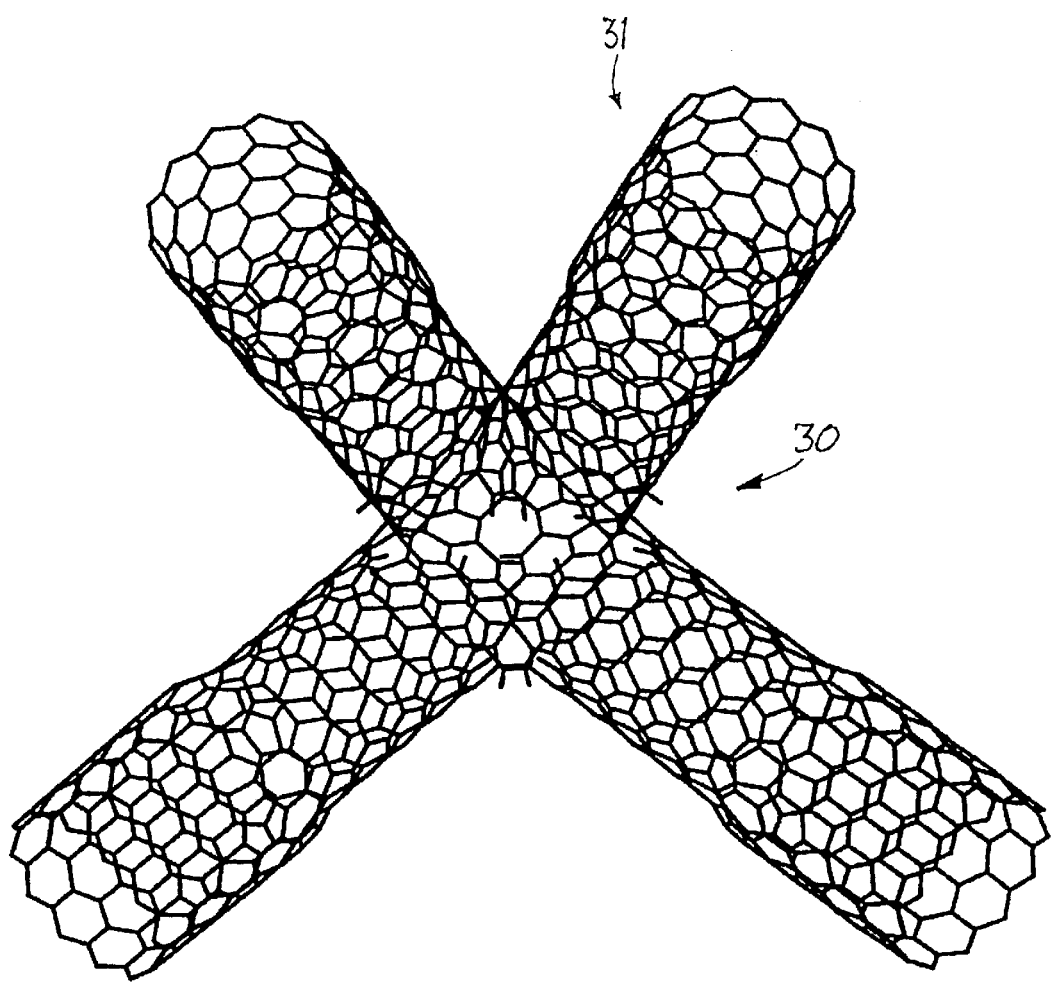
FIG. 10, FIG. 11 and FIG. 12 illustrate a four junction nanotube structure.

Other arrangements are also possible. Turning now to FIG. 10, there is illustrated a quantum dot arrangement in a tetrahedral lattice with the "metallic" core nanotube portion 30 being surrounded by a series of zigzag type nanotube arms eg 31. An electron pushed into the centralised core 30 will be in turn trapped there.

Figure 11:
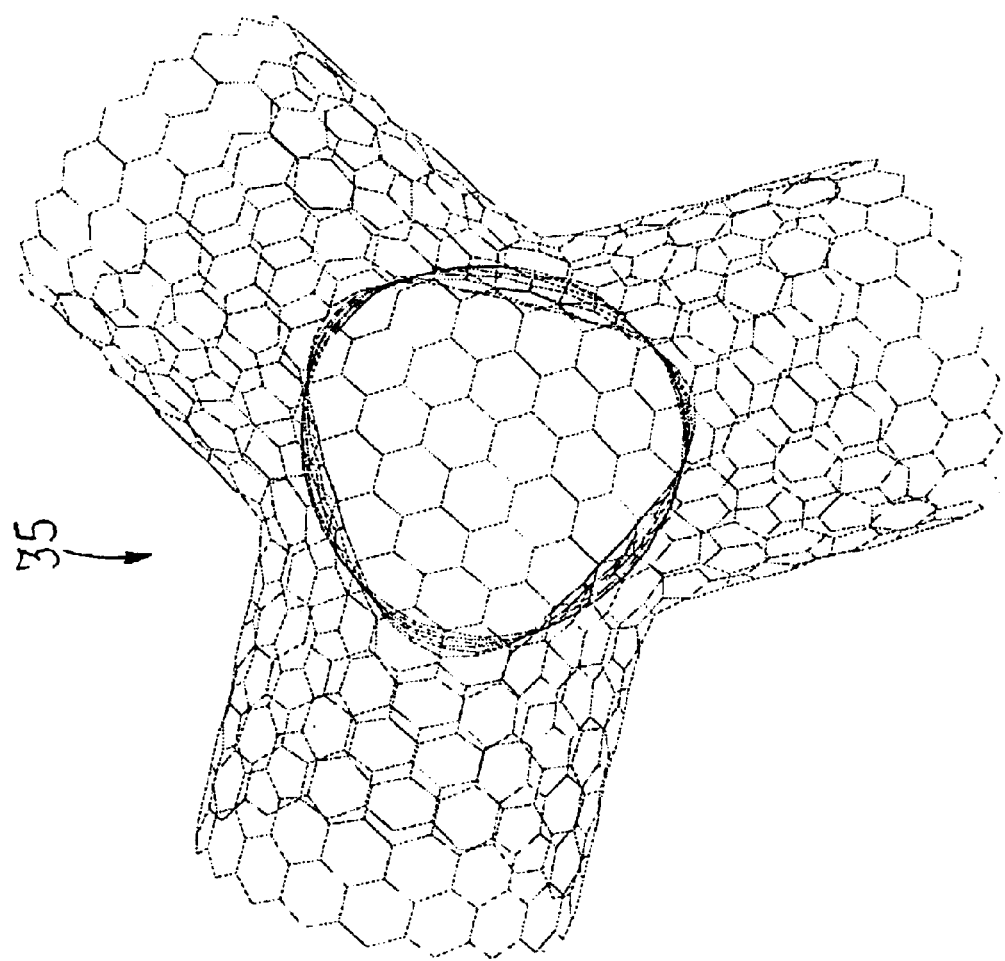
Figure 12:
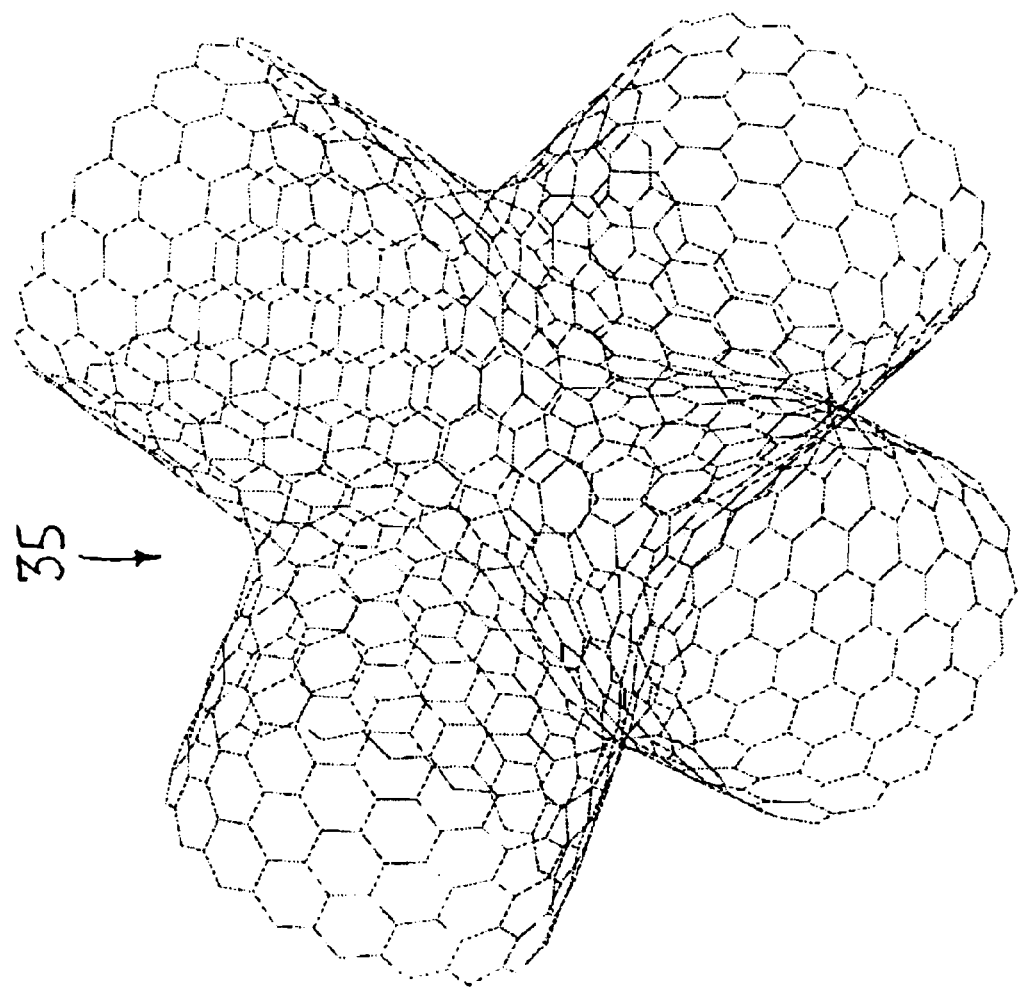
Figure 13:
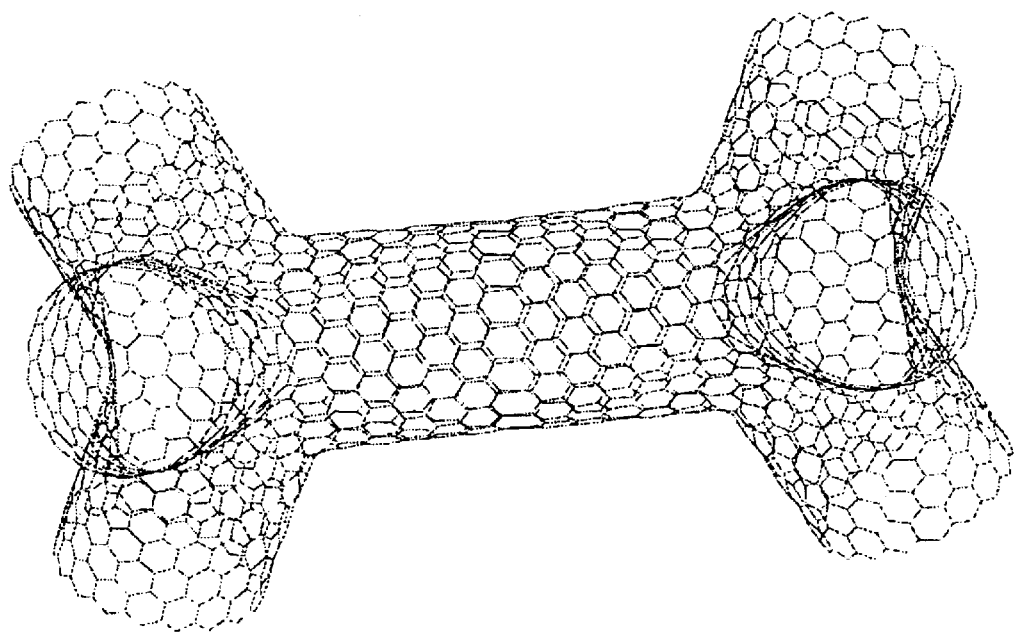
FIG. 13 to FIG. 15 illustrate various nanotube arrays built from elements shown in FIG. 11 and FIG. 12.
Figure 14:
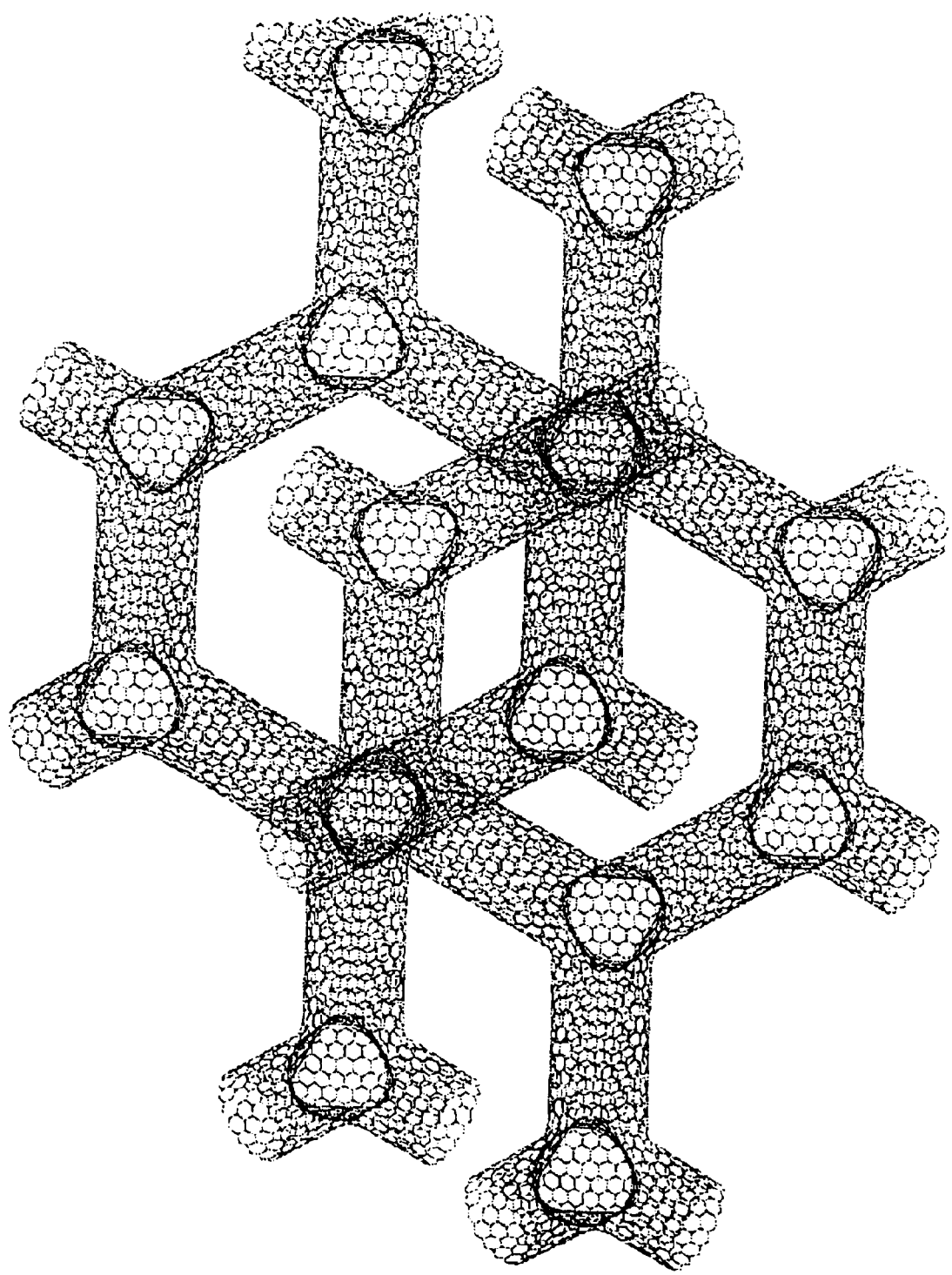
Figure 15:
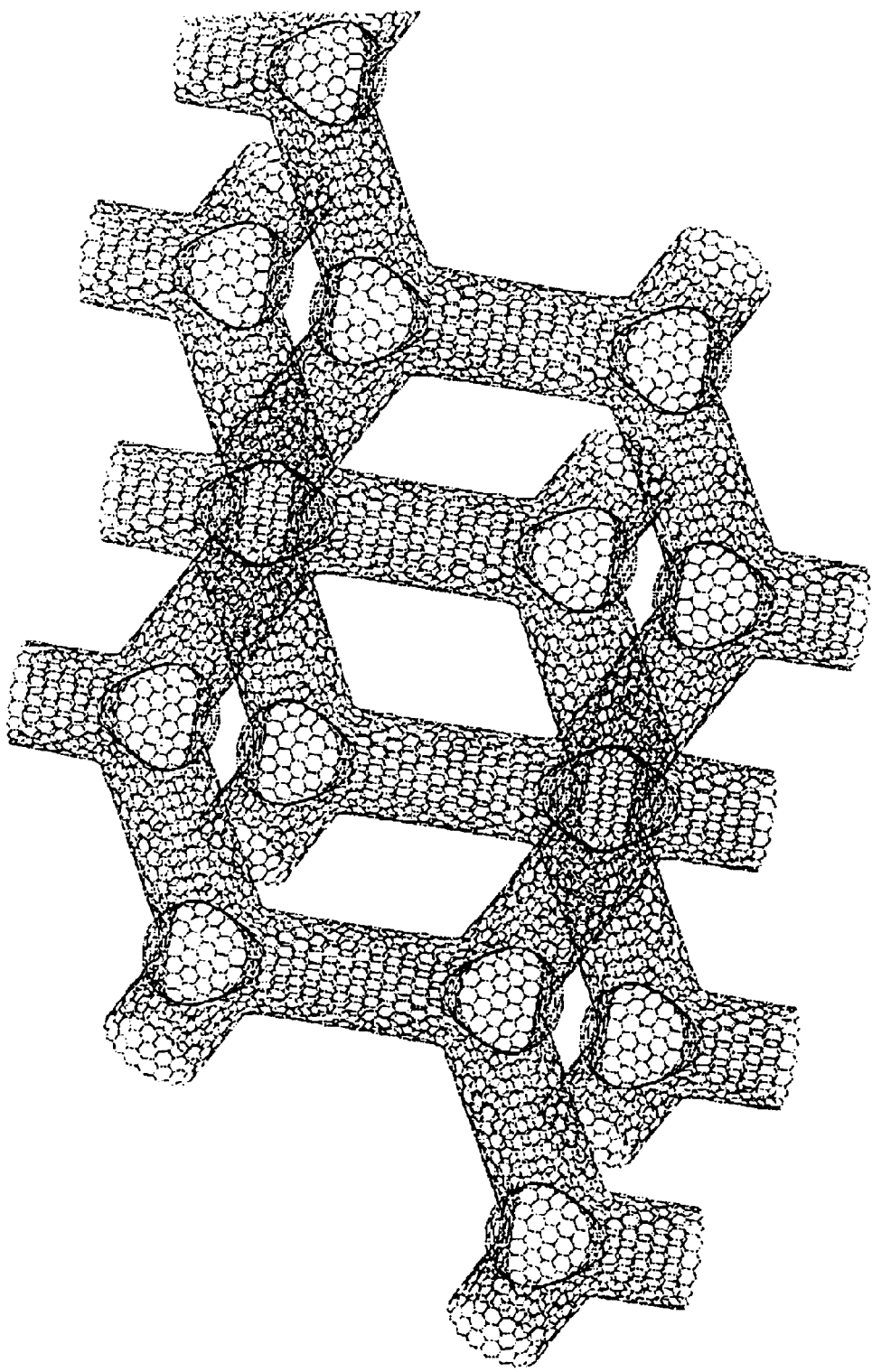
Figure 16:
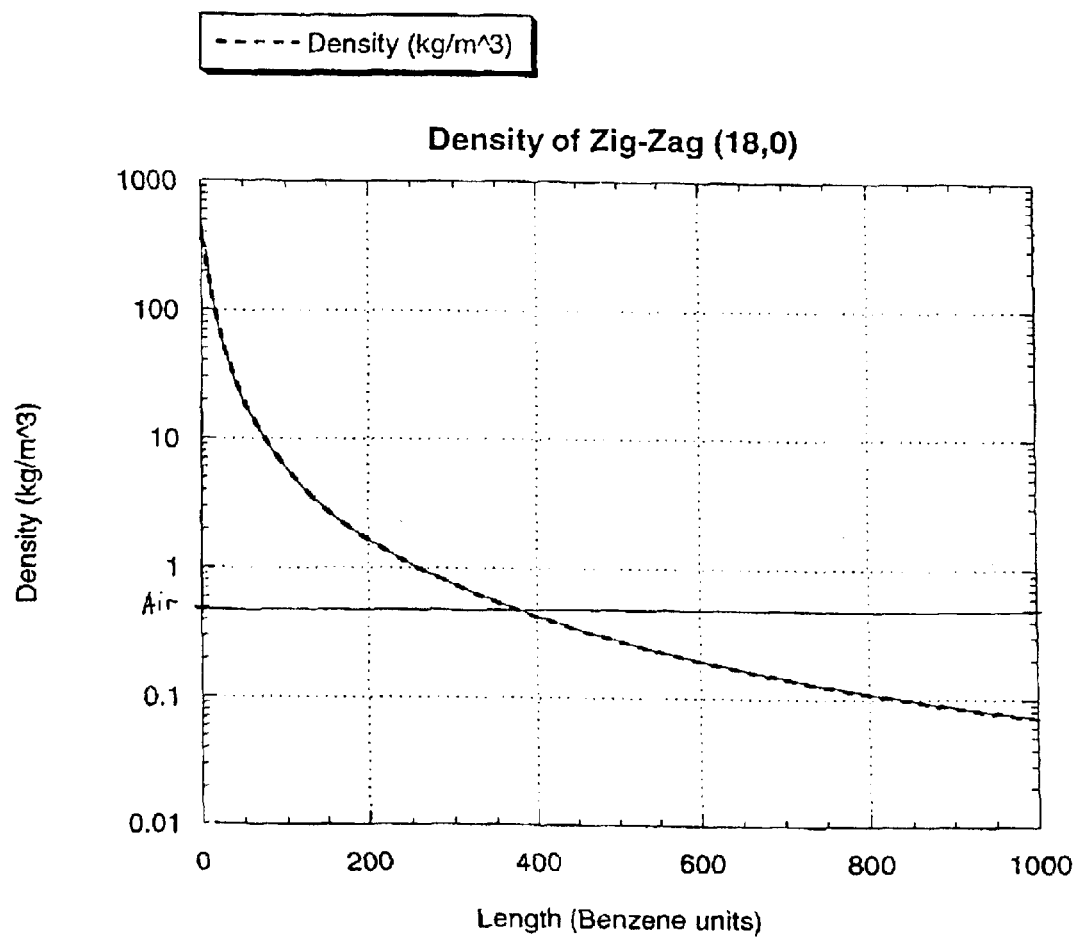
FIG. 16 illustrates the density of a nanotube mesh for different lengths of strut benzine units.

Turning now to FIGS. 11 and 12, there is illustrated an alternate tetrahedral junction 35 which is formed having su3 charbon at each junction. The arrangement has no inherent charge because it is alternate and it is formed from an Sp3 arrangement. The element 33 can be utilised as a structural element with various structural arrangements illustrated in FIG. 13 to FIG. 15. The structural arrangements have a number of important advantageous characteristics. For example, FIG. 16 illustrates a graph of the resulting density for different strut lengths of a basic element. (The strut length being twice the length shown on the graph). The graph of FIG. 16 being for (18,0) type nanotubes. The likely mechanical properties therefore of structures such as those illustrated in FIG. 13 to FIG.

15 include excellent high strength, high elasticity, high stretch, high compression and high twist. However, the arrangements are likely to have a low resistance to shear.

Arrangements disclosed hereinafter can be provided having a higher resistance to shear.

Figure 17:
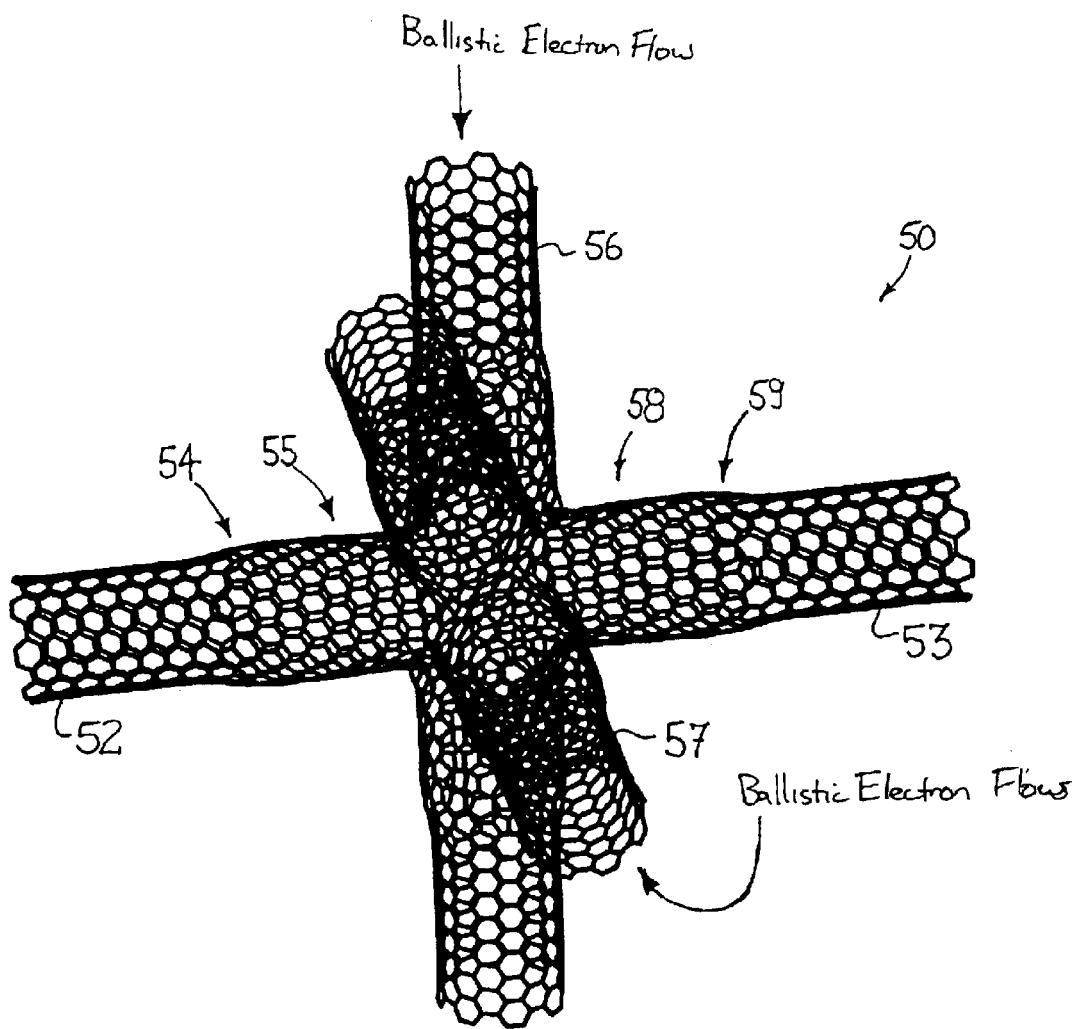
FIG. 17 illustrates a ballistic electron flow transistor structure.

Turning now to FIG. 17 there is illustrated a view of a modified transistor type junction element 50. In this case, the arms 52,53 have been modified so as to include Boron Nitrite bands eg. 54,55 and 58,59 which act as a quantum dot trap on either side of the arms eg 56,57 which in turn can allow for ballistic electron flow. The ballistic electron flow is effected by the quantum dot trap on either side and the quantum dot trap therefore controls the reflection of electrons flowing along the ballistic electron flow channels 56,57. The arrangement of FIG. 17, through the utilisation of quantum dot structures, dramatically reduces the likely gate current in comparison to the arrangement of FIG. 4. The arrangement 50 of FIG.

17 can be utilised as a multi level memory and the arms eg.

52,53,56,57 can be constructed in many different combinations through different functionalisations leading to a plethora of different capabilities.

A method of formation of complex 3 dimensional matrices containing the aforementioned devices in a predetermined arrangement will now be discussed.

Figure 18:
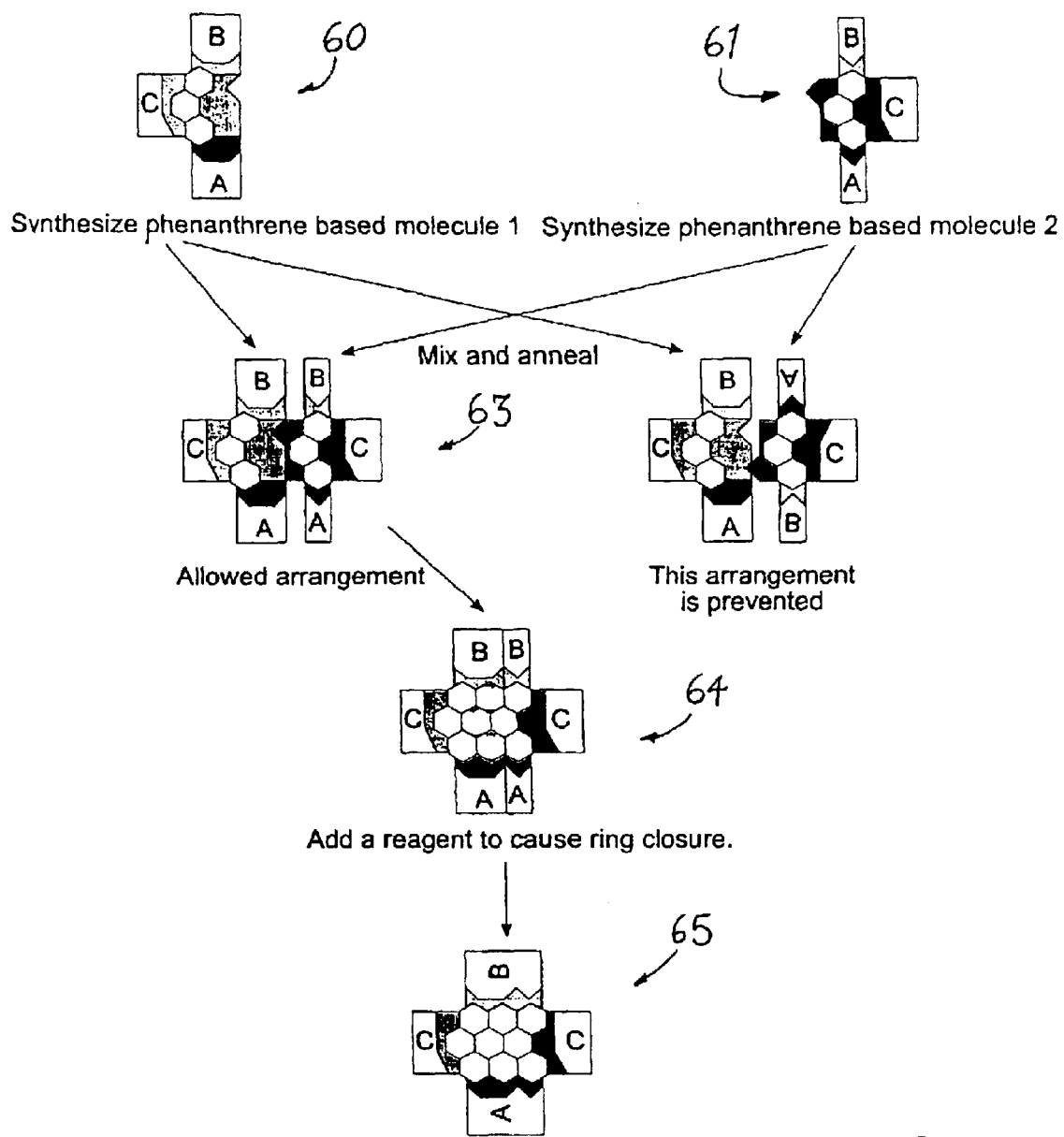
FIG. 18 illustrates the process of zigzag precursor synthesis.

Turning initially to FIG. 18, there will now be discussed the steps in forming a zigzag nanotube precursor element.

The first step is to prepare two molecules 60,61 which are synthetically accessible using standard organic chemistry techniques. Both molecules are considered as having four sides. Three of the sides contain hydrogen bonding moieties which are used at a later stage of the synthesis.

These are protected with three orthogonal protecting groups, labelled A, B and C. The fourth side has a hydrogen bonding pattern which is complementary between the two molecules. This pattern must be asymmetrical, to prevent reverse attachment.

The two elements 60,61 are mixed and annealed to allow an interconnection 63 which is later closed 64 so as to form a final product 65. This can be followed by dehydrogenation and purification. Dehydrogenation can occur using, for example, a palladium catalyst. Although dehydrogenation is shown at every major stage. In most cases, dehydrogenation will not be necessary until the final step in each entire synthesis.

Purify the product to separate it from any remaining unjoined fragments and ring closure reagent. There is a substantial difference in molecular weight between the reagents and the product, so various forms of purification can be used.

Figure 19:
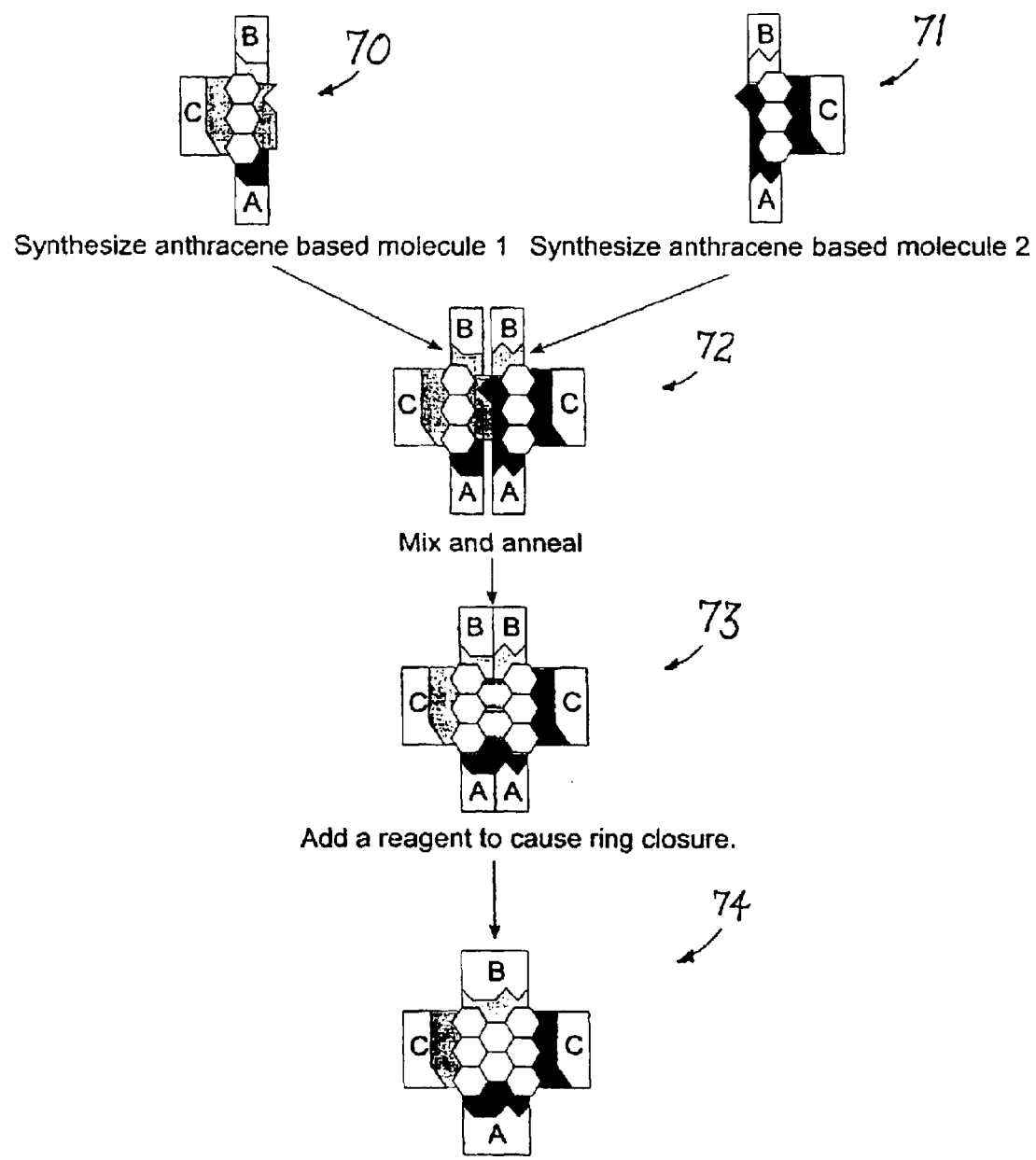
FIG. 19 illustrates the process of armchair (8,8) precursor synthesis.

Turning now to FIG. 19, there is illustrated the process of armchair (8,8) precursor synthesis. The first step is to prepare two molecules 70,71 which are synthetically accessible using standard organic chemistry techniques. Both molecules are considered as having four sides. Three of the sides contain hydrogen bonding moieties which are used at a later stage of the synthesis.

These are protected with three orthogonal protecting groups, labelled A, B and C. The fourth side has a hydrogen bonding pattern which is complementary between the two molecules. This pattern must be asymmetrical, to prevent reverse attachment.

The result is mixed 72 and annealed 73 and a reagent is added to cause ring closure so as to form precursor fragment 74.

Figure 20:
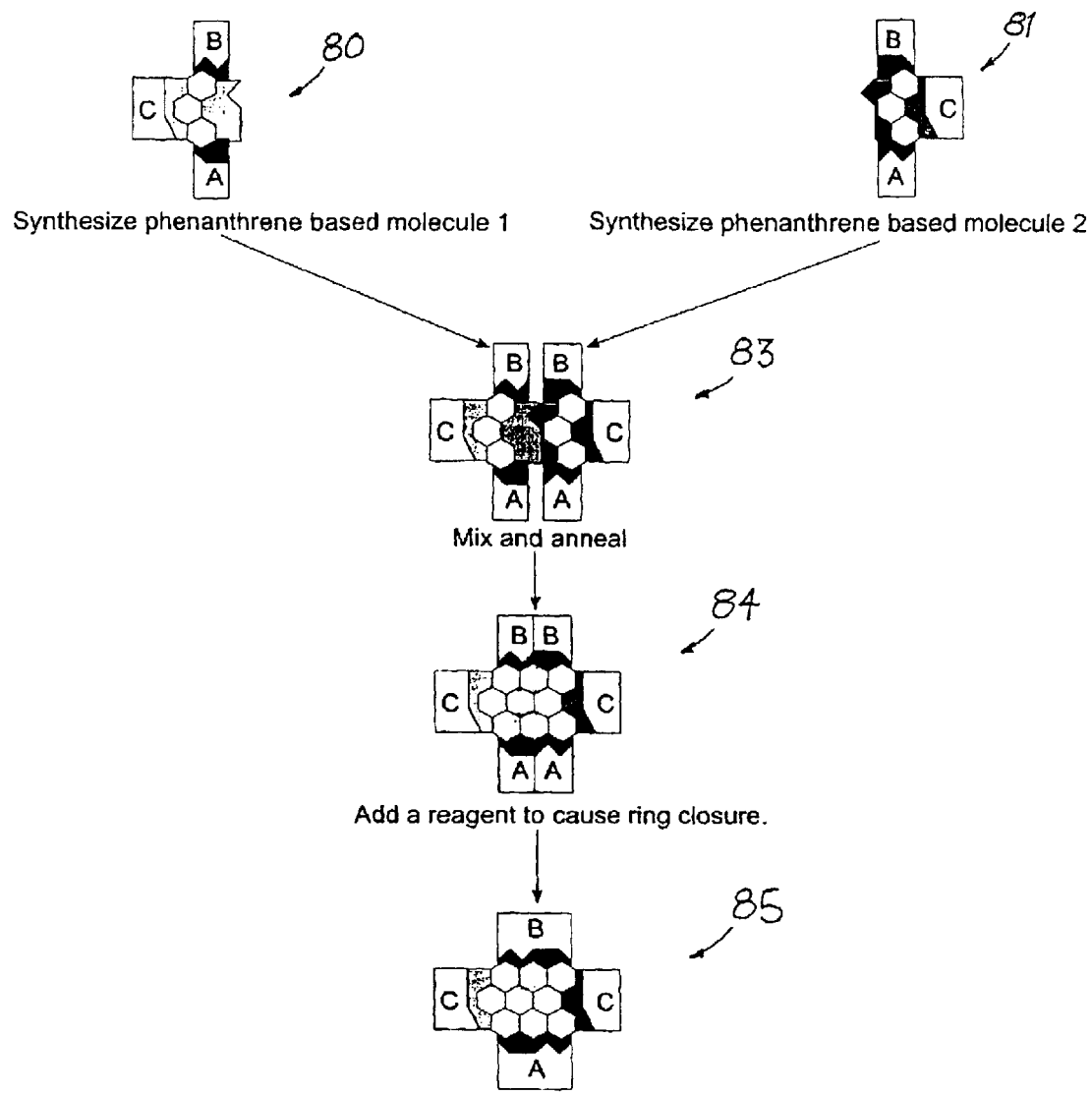
FIG. 20 illustrates the process of double ended zigzag precursor synthesis.

FIG. 20 illustrates the process of double ended (16,0) nanotube precursor synthesis. The first step is to prepare two molecules 80,81 which are synthetically accessible using standard organic chemistry techniques.

Both molecules are considered as having four sides. Three of the sides contain hydrogen bonding moieties which are used at a later stage of the synthesis. These are protected with three orthogonal protecting groups, labelled.

A, B and C. The fourth side has a hydrogen bonding pattern which is complementary between the two molecules. This pattern must be asymmetrical, to prevent reverse attachment.

The result is mixed 83 and annealed 84 and a reagent is added to cause ring closure 85.

The aforementioned fragments can then be utilized in forming various nanotube segments as will be described in further detail hereinafter.

Figure 21:
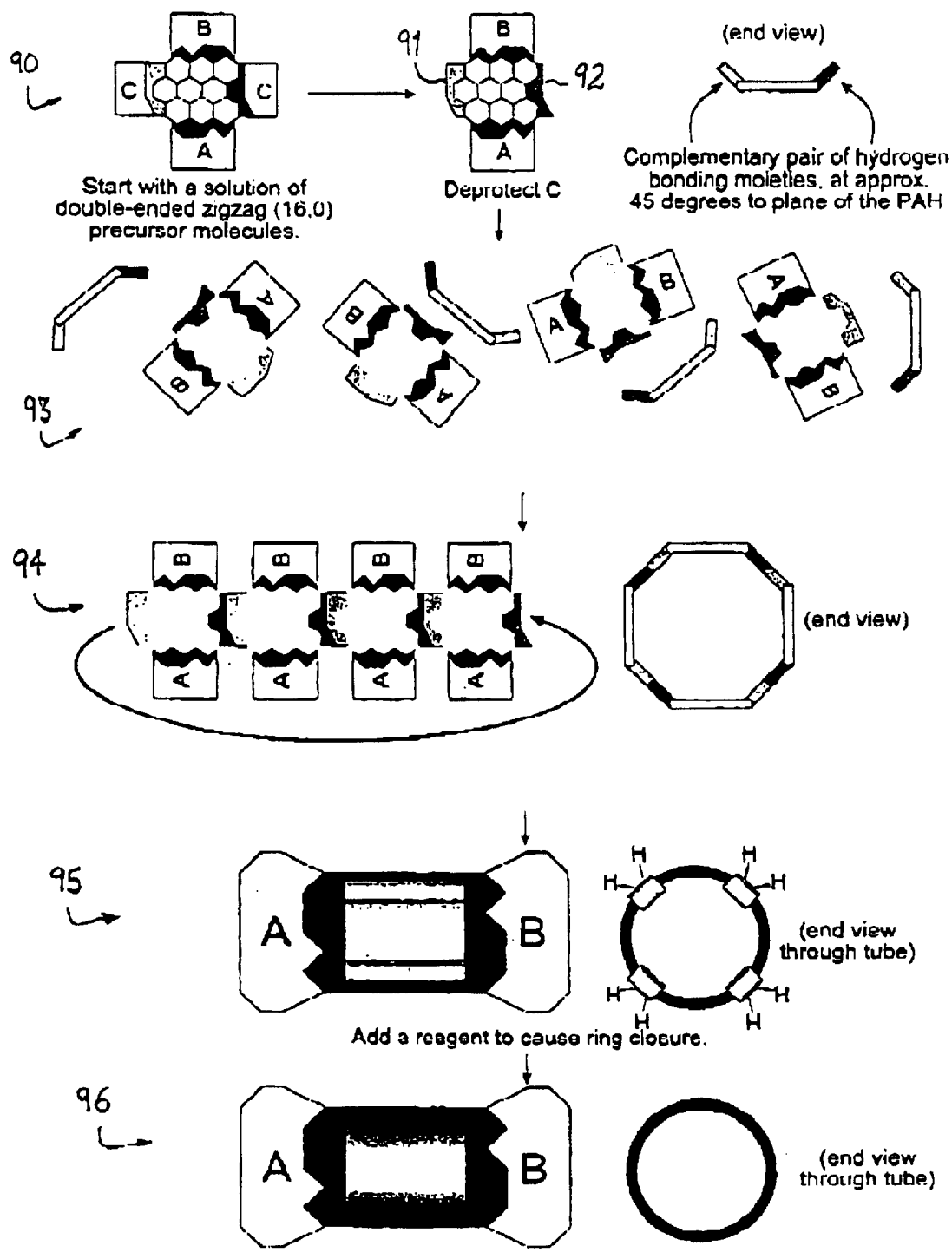
FIG. 21 illustrates the process of double ended zigzag nanotube synthesis.

Turning initially to FIG. 21, there is illustrated the process of forming double ended zigzag (16,0 nanotube fragments). Starting with a functionalised PAH 90,91 such as benzol [G, H, I] peryelene having functionalised end portions 92,93, a solution of such components 93 is heated to a temperature sufficient to disrupt the hydrogen bonding but insufficient to denature any covalent bonds. The solution is then agitated and slowly reduced in temperature (annealed) to a temperature where the hydrogen bonds are highly stable. This process anneals the fragments into their optimal configuration 94 which comprises a loop component. A reagent is then added to the mix so as to cause ring closure 95. Subsequent dehydrogenation can occur using, for example, a palladium catalyst. Subsequent purification can separate the product 96 from any remaining unjoined fragments and any reagents.

Figure 22:
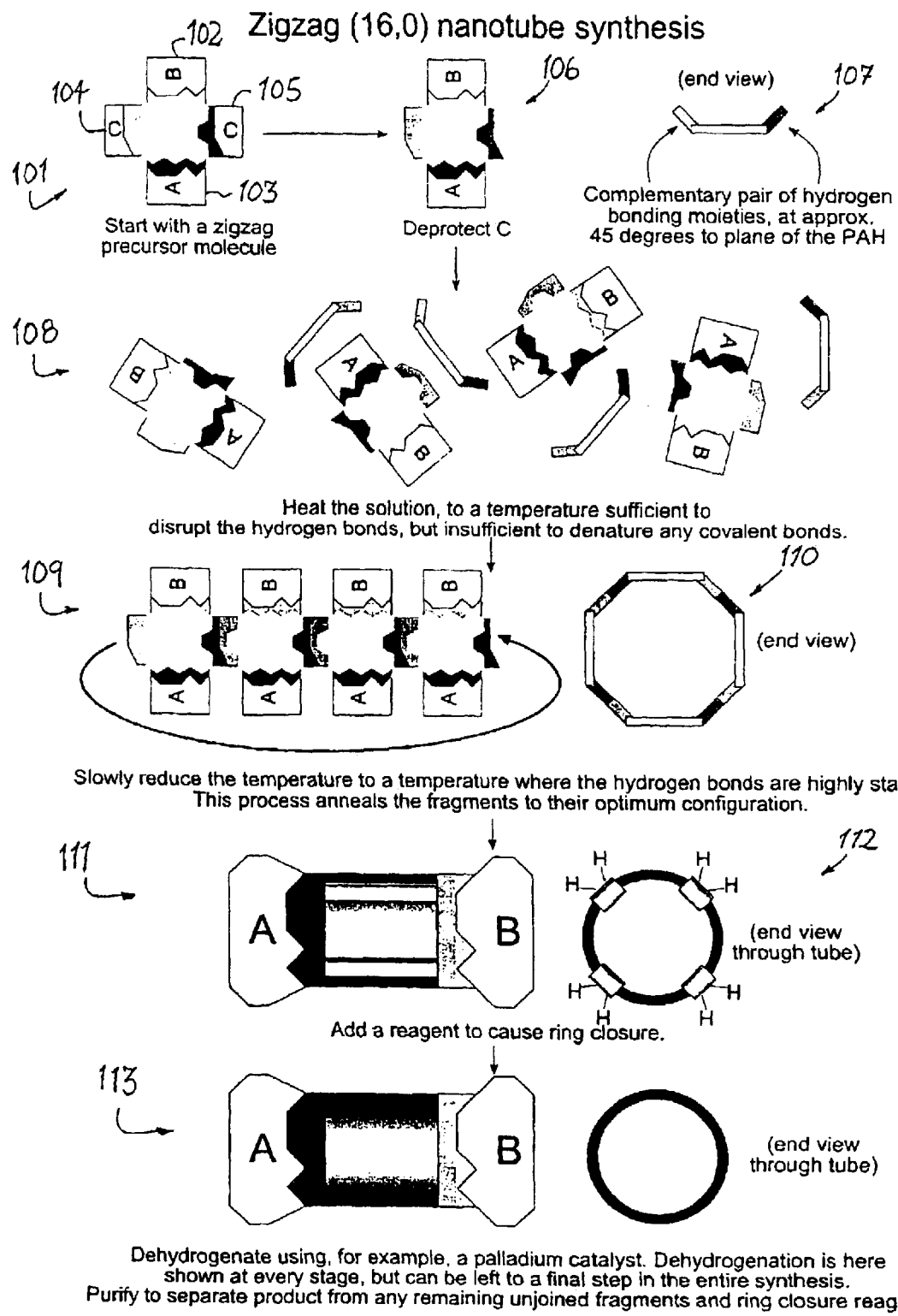
FIG. 22 illustrates the process of zigzag nanotube synthesis.

Turning now to FIG. 22, there will now be described a process of fabrication of zigzag (16,0) nanotube components. Starting with a zigzag precursor molecule 101 having functionalized end portions 102–105 the end portions 104, 105 are de-protected 106,107. A solution 108 of the components is heated to a temperature sufficient to disrupt the hydrogen bonding but insufficient to denature any covalent bonds. The annealing temperature is slowly reduced to a point where the hydrogen bonds are highly stable. The process anneals the fragments into their optimal configuration 109–112. Subsequently, a reagent is added to cause ring closure 113. Finally, the elements 113 are dehydrogenated using, for example, a palladium catalyst. Subsequent purification steps can separate the product from any remaining unjoined fragments and ring closure reagent.

It will be readily evident that the abovementioned synthesis process can also be applied to other nanotube fragments of different chirality.

Figure 23:
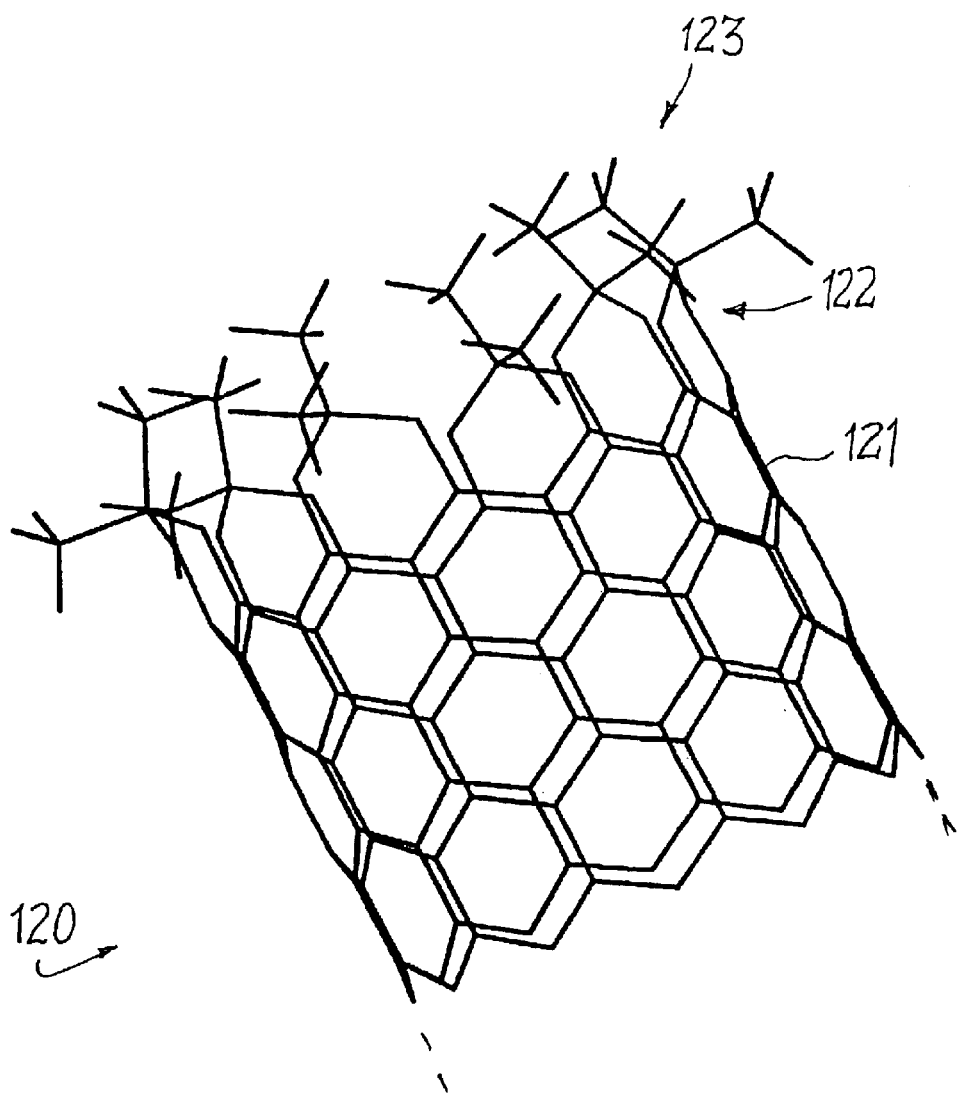
FIG. 23 illustrates the process of functionalization and protection of an end of a nanotube fragment.

Turning to FIG. 23, there is illustrated an example nanotube fragment 120 in more detail. The fragment can comprise the graphitic layer 121 followed by a reactive oxygen layer 122 which is masked by an ispropyl termination layer 123.

The aforementioned techniques of construction of nanotube components can be extended to provide for other nanotube structures such as diodes etc. and a number of structures will now be described.

Figure 24:
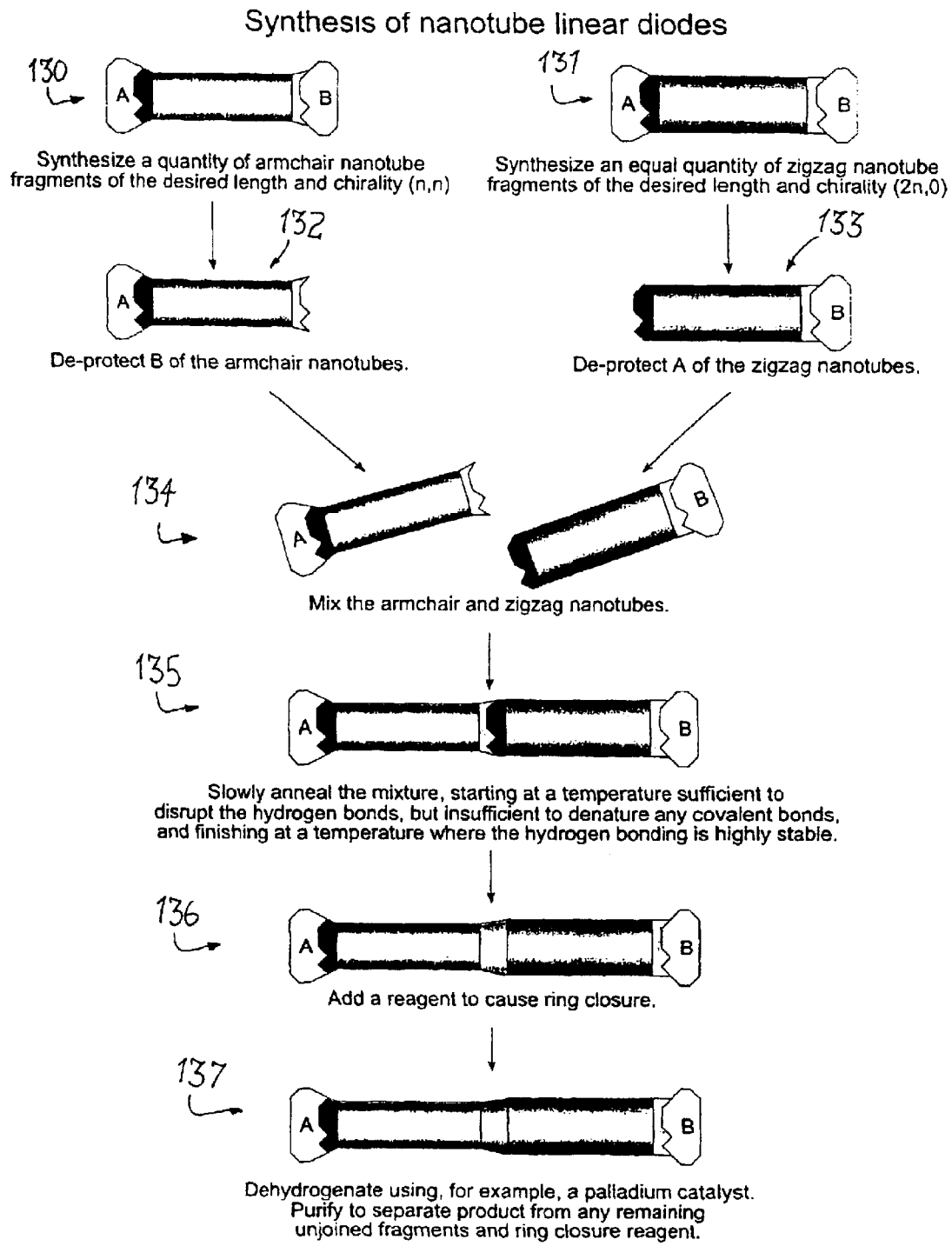
FIG. 24 illustrates the process of nanotube linear diode synthesis.

Starting with FIG. 24, which shows a process of synthesis of nanotube linear diodes the starting material can include separately synthesised nanotube components 130,131 with the components 130 being armchair nanotube fragments and the components 131 being zigzag-type nanotube components. Each of the components 130,131 having protected ends. The first step being to de-protect the end B of the armchair nanotube 130 and the end A of the zigzag nanotube 131 to form nanotube components 132 and 133. The nanotubes having de-protected ends are then mixed in a solution 134 and the solution allowed to slowly anneal starting at a temperature sufficient to disrupt the hydrogen bond but insufficient to denature any covalent bonds and finishing at a temperature where the hydrogen bonding is highly stable 135. Next, a reagent is added so as to ensure closure 136 and the result dehydrogenated using, for example, a palladium catalyst. The solution can then be purified to separate the diode product from any remaining unjoined fragments and ring closure reagents.

Figure 25:
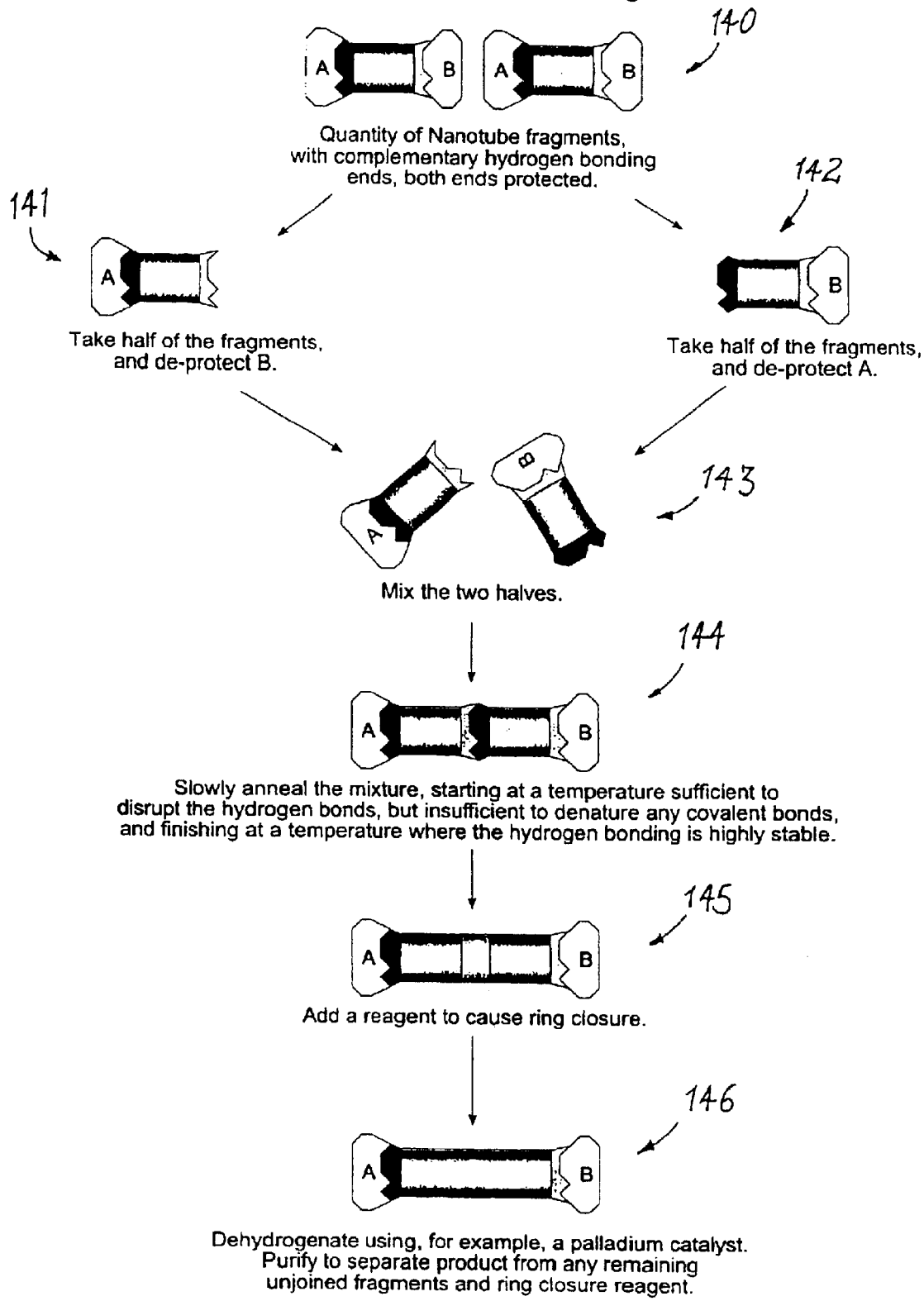
FIG. 25 illustrates the process of increasing the length of an armchair nanotube.

Turning now to FIG. 25, there is illustrated a method of increasing the length of a nanotube component. Starting initially with a quantity of nanotube fragments 140, with half of the fragments, the B end is de-protected 141 and with the other half of the fragments A end is de-protected 142. The two halves are mixed 143 and slowly annealed starting at a room temperature sufficient to disrupt the hydrogen bonds but insufficient to denature any covalent bonds and finishing at a temperature where the hydrogen bonding is highly stable 145. Subsequently, a reagent is added to cause ring closure with subsequent dehydrogenation occurring.

Figure 26:
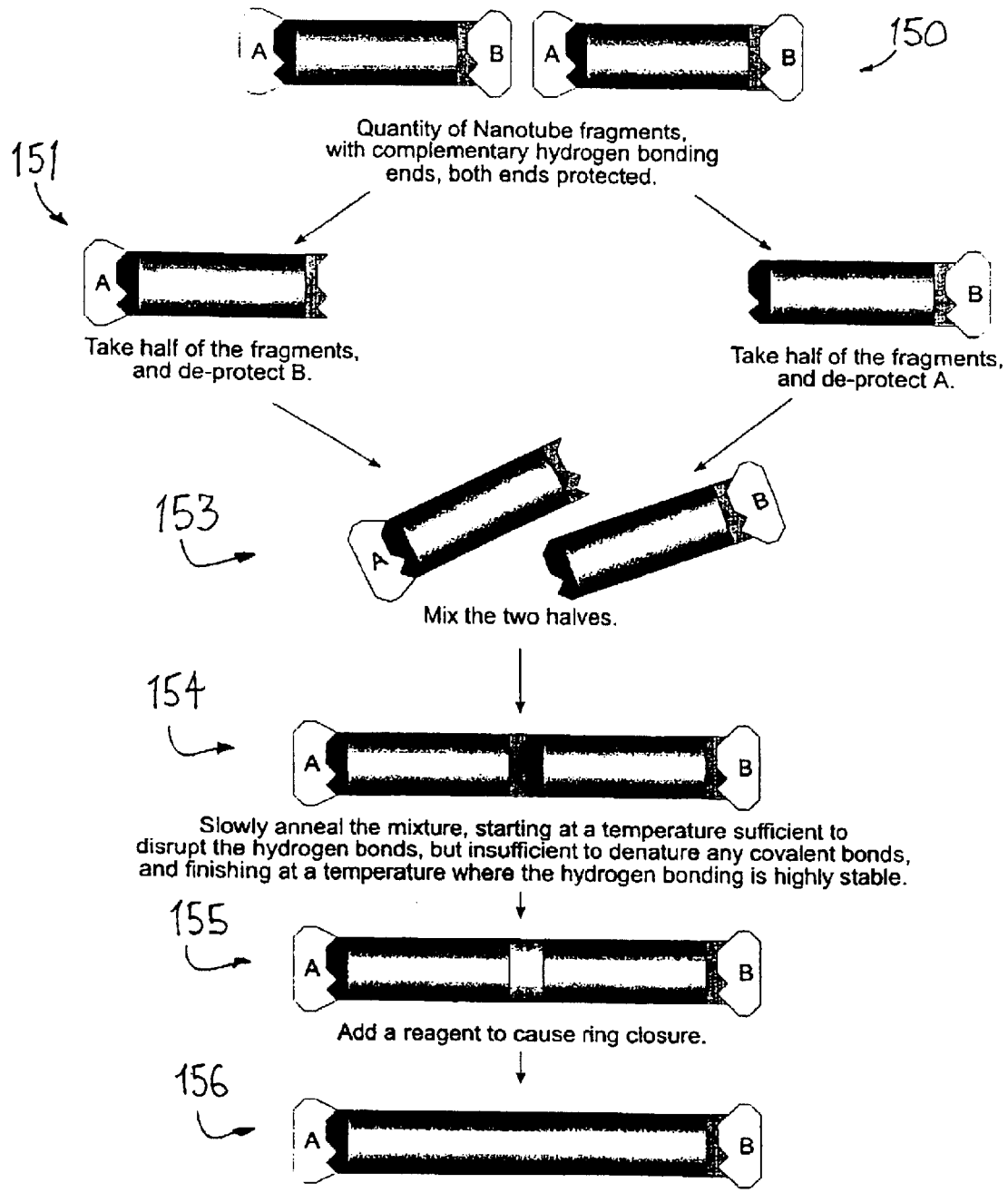
FIG. 26 illustrates the process of further increasing the length of an armchair nanotube.

Turning now to FIG. 26, there is illustrated a process of extending a length of a nanotube fragment. Starting initially was a quantity of nanotube fragments 150 with complimentary hydrogen bonding ends, both ends are protected. With half the fragments, the end B is deprotected 151 and with the other half of the fragments, the end A is deprotected 152. The two halves mixed 153 and slowly annealed 154 starting at a temperature sufficient to disrupt the hydrogen bonds but insufficient to denature any covalent bonds and finishing at a temperature where hydrogen bonding is highly stable 155. A reagent is then added so as to cause ring closure 156.

Figure 27:
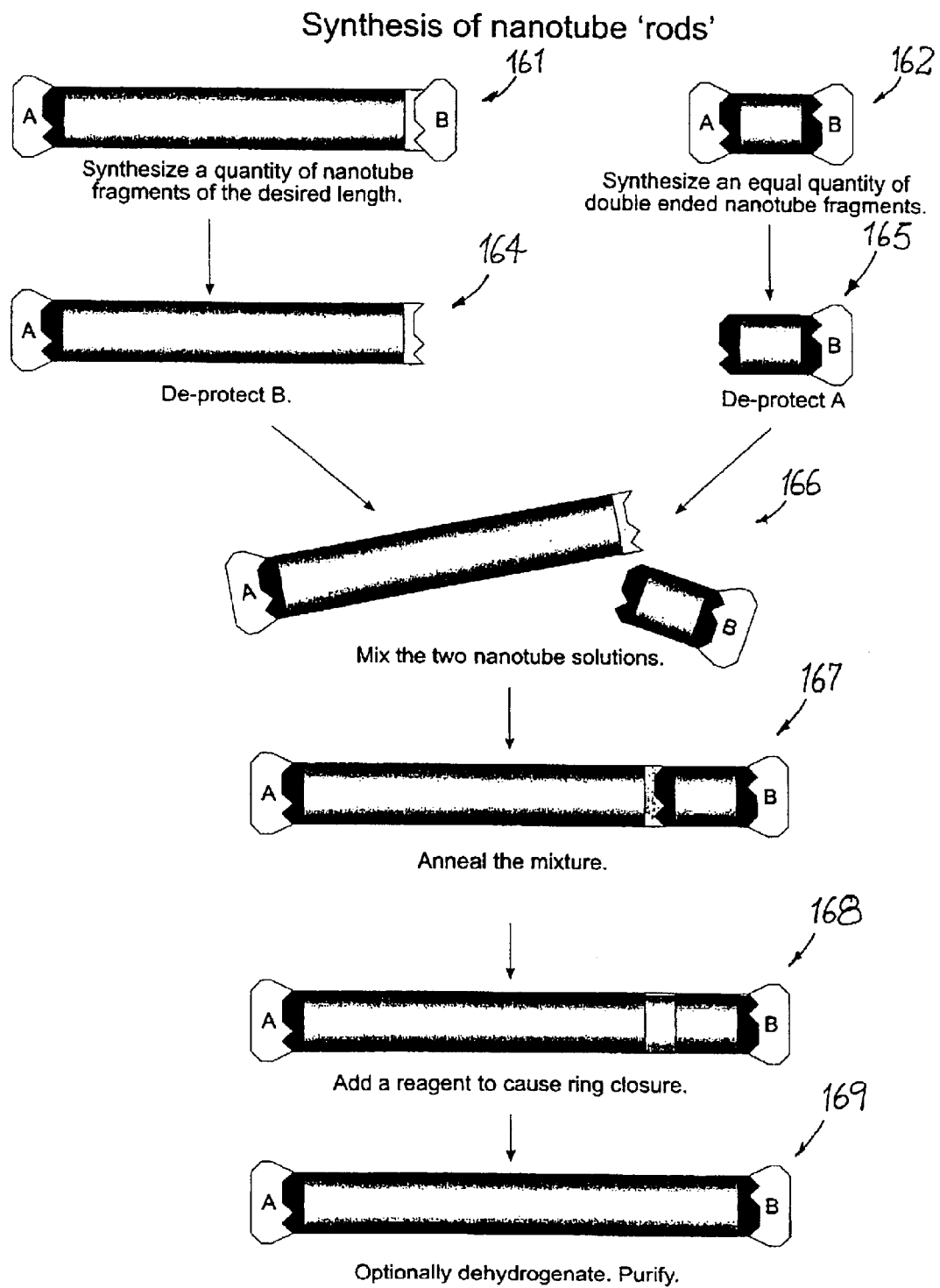
FIG. 27 illustrates the process of synthesis of nanotube rods.

Turning now to FIG. 27, there is illustrated a process of extending the length of nanotube fragment. In this process, two nanotube fragments 161 and 162 are deprotected 164, 165 before being mixed together 166. The mixture is slowly annealed 167 and a reagent added 168 causing ring closure with the final result 169 including optional dehydrogenation and purification. The aformentioned process can be utilized to build up a arbitrary 3 dimensional mesh of nanotube type components.

Figure 28:
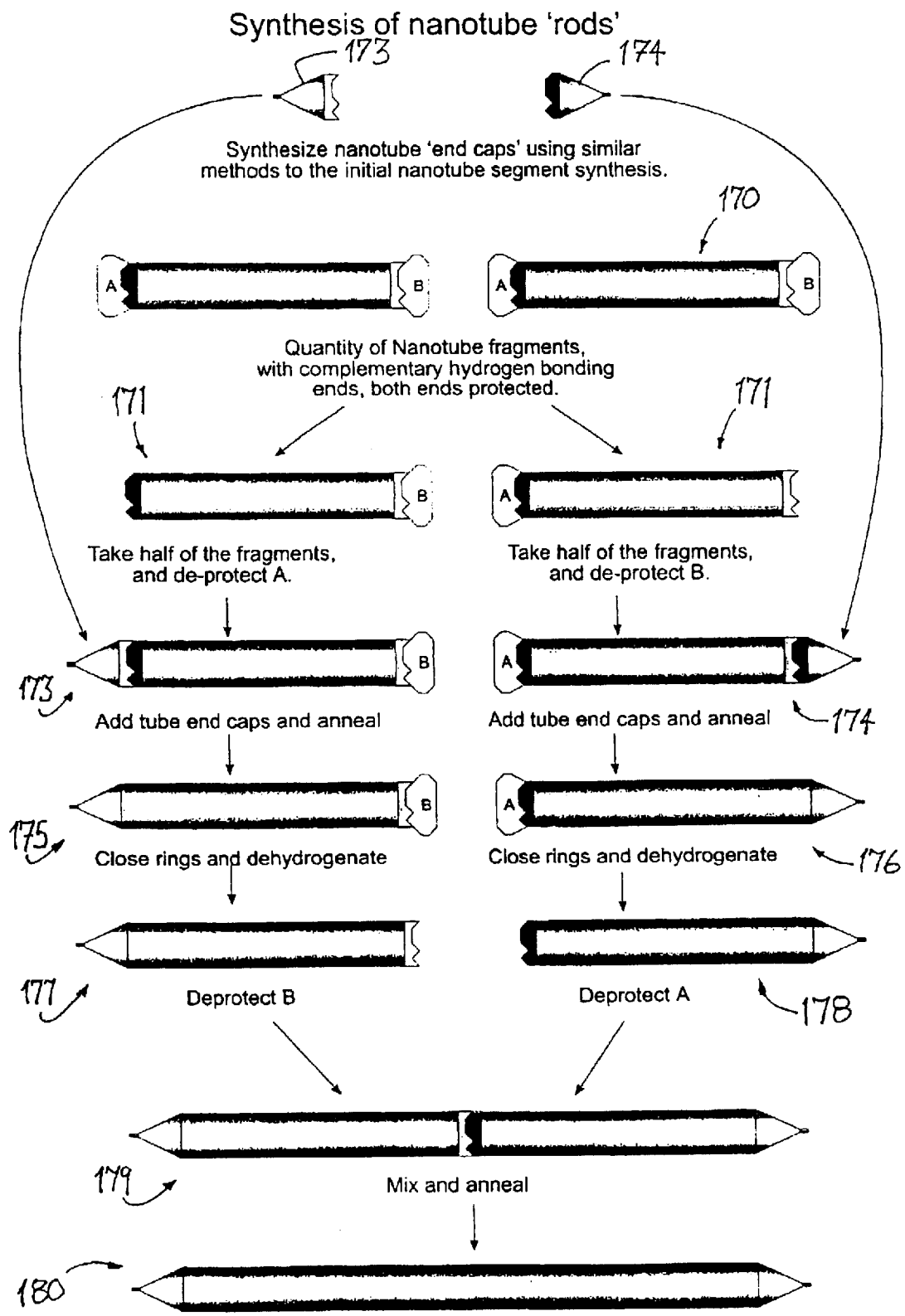
FIG. 28 illustrates the process of synthesis of nanotube rods with end joiners.

Turning now to FIG. 28, there is illustrated a process of synthesis of nanotube rods having capped ends. Initially, A quantity of nanotube fragments 170 are utilized having complementary hydrogen bonding ends and both sides protected. Half of the fragments 170 have a first end deprotected 171 with the other half of the fragments 172 having their second end deprotected. A capping unit 173, 174 which can be synthesised using similar methods to the initial nanotube segment synthesis, to the corresponding mixture 173,174 and the mixture annealed. The subsequent closing 175,176 proceeds in the usual manner. The rods formed by the process described in FIG. 28 can then be matched with corresponding "balls" to form an overall matrix. One form of formation of the "balls" and rods will be described with reference to FIG. 29. Subsequently, the other end is de-protected eg. 177,178 and the two mixtures are added together and annealed 179 so as to form loosely bound structures 179 which are subsequently closed and dehydrogenated 180.

Figure 29:
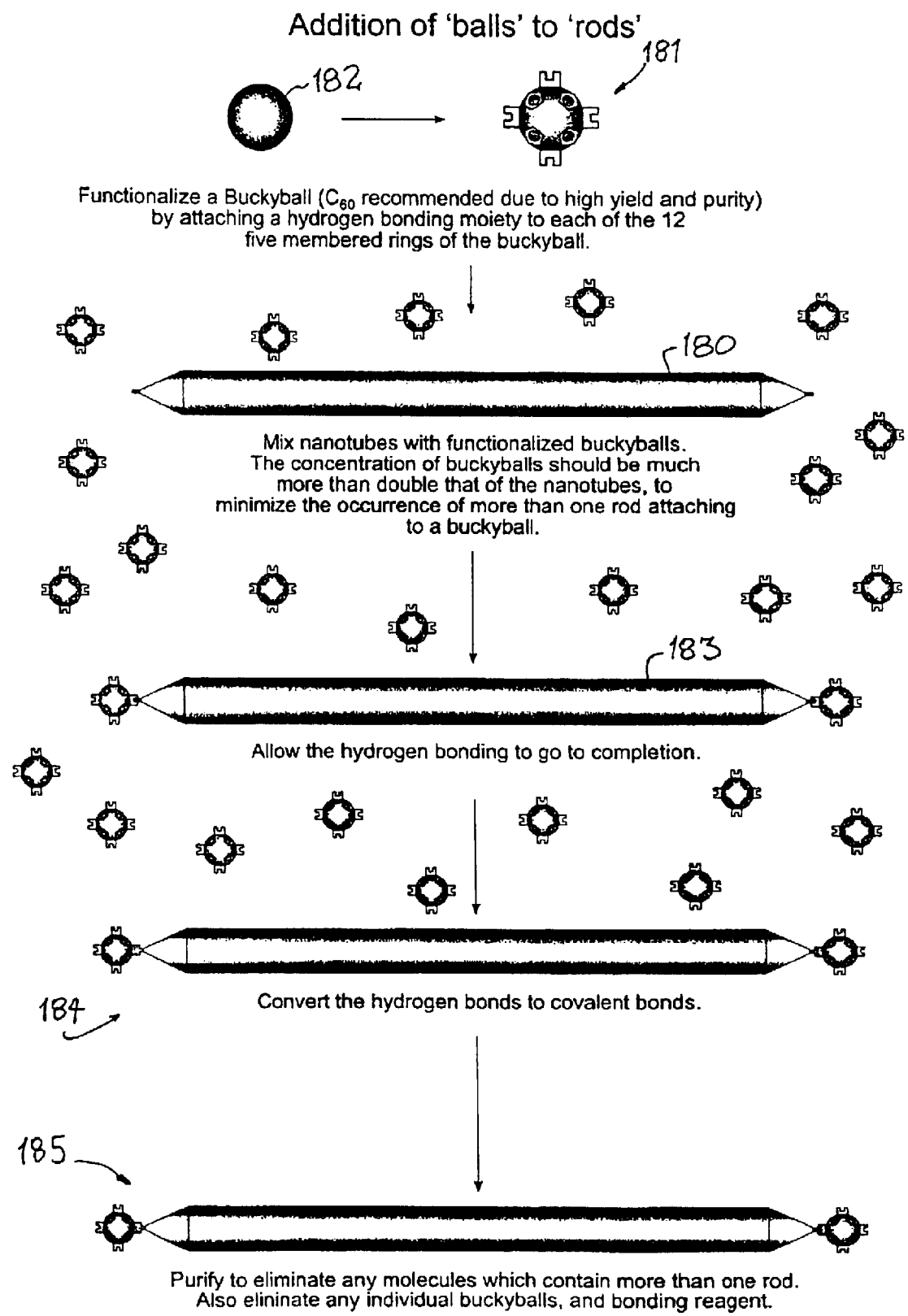
FIG. 29 illustrates a first method of joining balls' to nanotube rods.

Turning now to FIG. 29, there is illustrated the processing steps in one method of construction of components in creating a matrix. The first step is to functionalise 181 a buckyball 182 by attracting a hydrogen bonding moiety to each of the 12 five member rings of the buckyball. The nanotube components (180 of FIG. 28) are then mixed with the functionalised buckyballs 181. The concentration of buckyballs should be much more than double that of the nanotubes, to minimise the occurrence of more than one rod attaching to a single buckyball. The hydrogen bonding is allowed to go to completion 183 and a reagent added to convert the hydrogen bond to covalent bonds 184.

Finally, the rods are purified 185 to eliminate any molecules which contain more than one rod in addition to eliminating any individual leftover buckyballs and bonding reagent.

Figure 30:
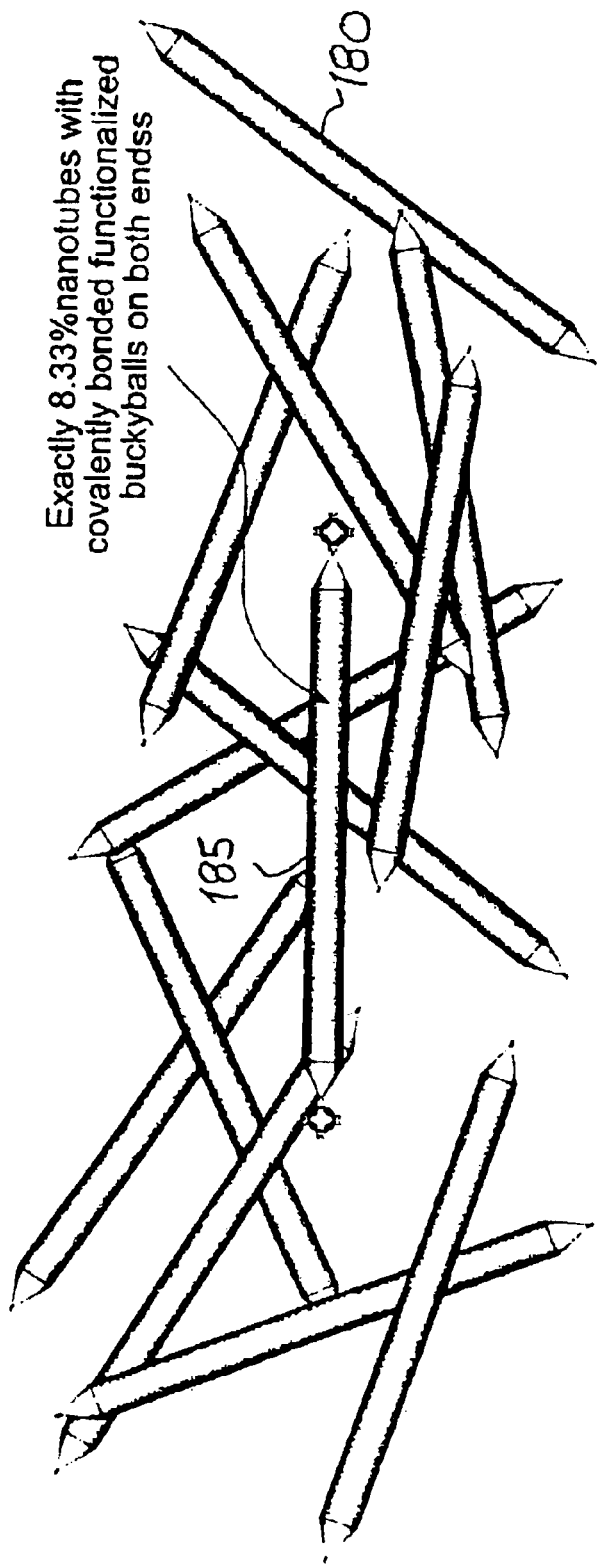
FIG. 30 illustrates the process of synthesis of a low density nanotube crystal.

Next, as illustrated in FIG. 30, a mixture of nanotubes 180 and nanotubes with covalently bonded functionalised buckyballs on the ends 185 is provided.

Figure 31:
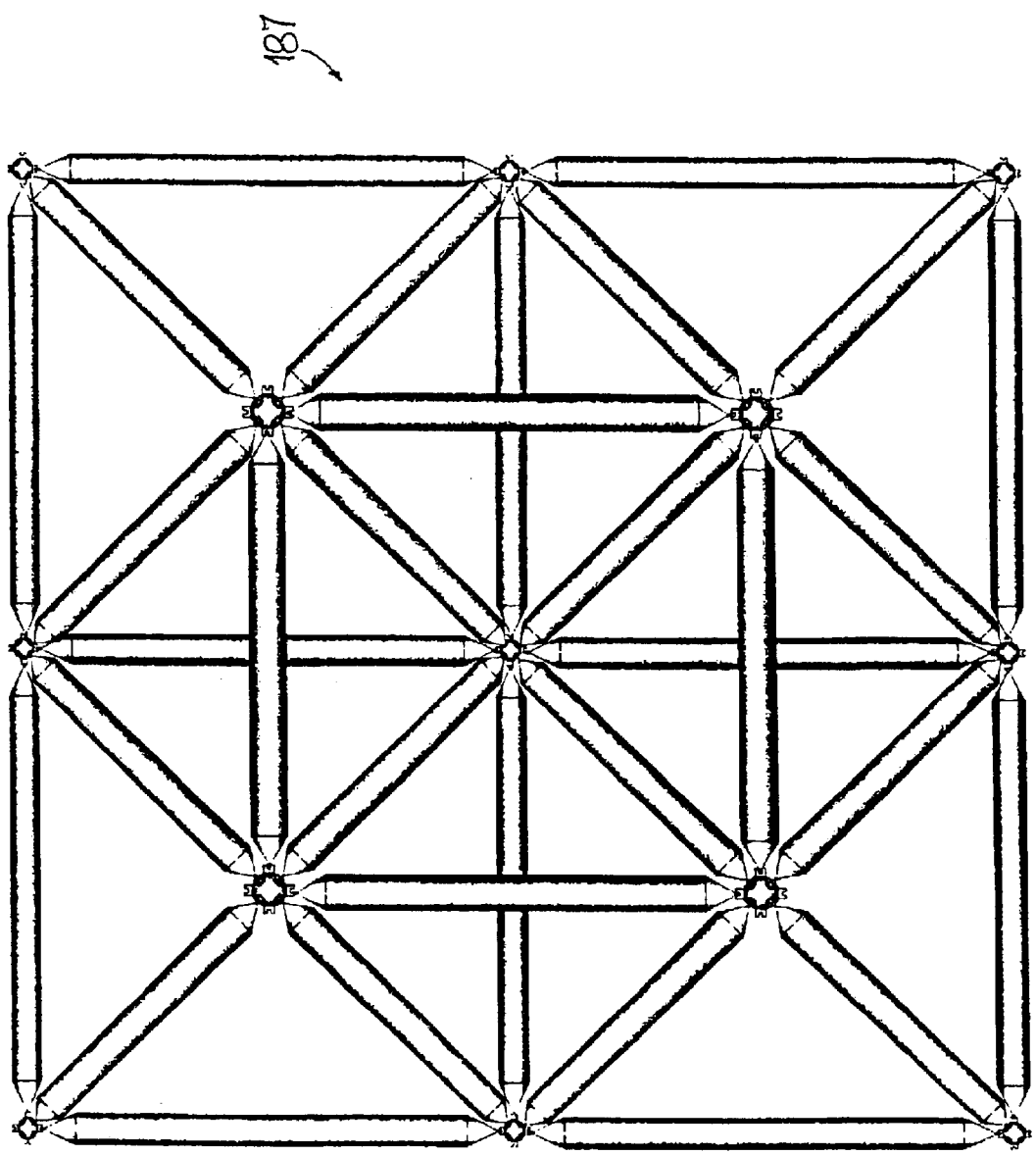
FIG. 31 illustrates a low density nanotube crystal.

Preferably, exactly 8.33% of nanotubes 120 are provided in the mixing ratio. A dilute solution of nanotube rods is prepared with 11 of every 12 rods having no buckyball termination while the remaining 12 have a buckyball termination at both ends. The volume of solvent is preferably greater than the volume of the desired expanded nanotube mesh. The nanotube mesh is then annealed very slowly so as to form a mesh 187 as illustrated in FIG. 31.

The hydrogen bonded interaction with the buckyball must be strong enough to allow for self assembly of the matrix 187.

The slow annealing allows a smaller hydrogen bond energy.

After annealing, a reagent is added which converts the hydrogen bonds to covalent bonds. Finally, the solvent is drained and the structure 187 is filled with an inert gas.

Alternatively, a different mesh can be formed through the utilisation of an alternative hub components to the buckyball hub 181 components as previously shown in FIG.

29. The alternative arrangement begins with the synthesis of hub fragments as illustrated in FIG. 32. The hub fragments 190 can be synthesised using organic synthesis techniques. The fragments can be functionalized with complementary patterns of hydrogen bonding moieties on two sides of the PAH.

On a third side is a pattern of hydrogen bonding moieties which is complementary to that used on one end of compatible nanotube fragments. This is shown protected with B. The forth side has a rotational self-complementary pattern of hydrogen bonding moieties, which are protected with the orthogonal protecting groups A. A solution of components 191 is then heated to a temperature sufficient to disrupt the hydrogen bonds. but insufficient to denature any covalent bonds. The temperature is slowly reduced to a point where the hydrogen bonds are highly stable. This results with the formation of fragments 192. A reagent is then added so as to form final hub fragments 193.

Figure 33:
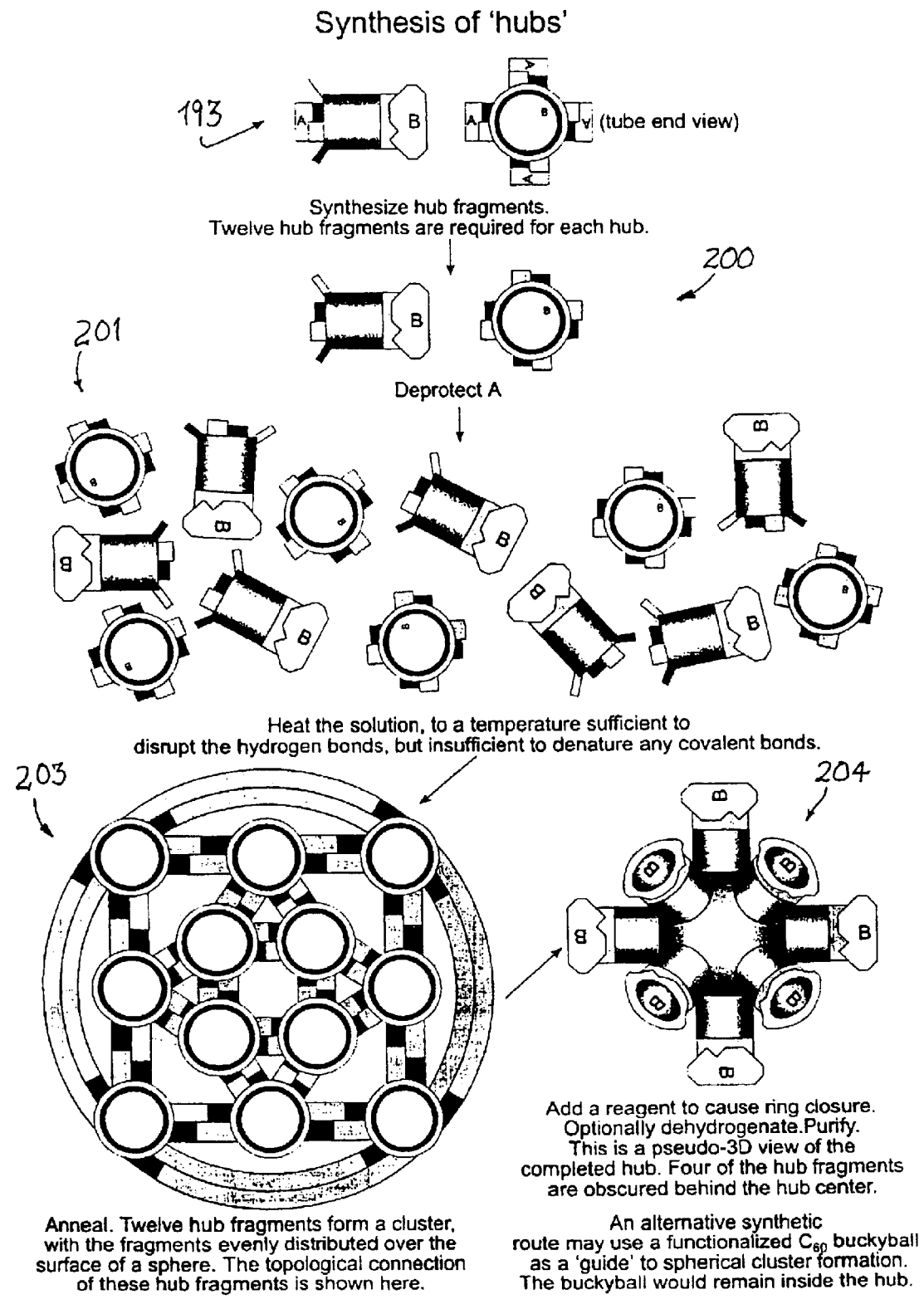
FIG. 33 illustrates the process of forming hub components.

The hub fragments are then formed into hub units as illustrated in FIG. 33. A hub unit 204 is constructed from 12 hub fragments 193. The first step 200 is to de-protect the reactive component of a large number of hub fragments and add them into a solution 201 which is heated to a temperature sufficient to disrupt the hydrogen bonds but insufficient to denature any covalent bonds. The fragments are annealed such that 12 hub fragments form a cluster with the fragments evenly distributed over the surface. The typological interconnection is illustrated 203 with a "perspective" 204 of a single hub being also provided. A reagent is added to cause ring closure and optional dehydrogenation is carried out followed by purification.

An alternative synthetic route may be to use a functionalised C60 buckyball as a "guide" to spherical clustered hub formation with the buckyball remaining inside the hub.

Figure 34:
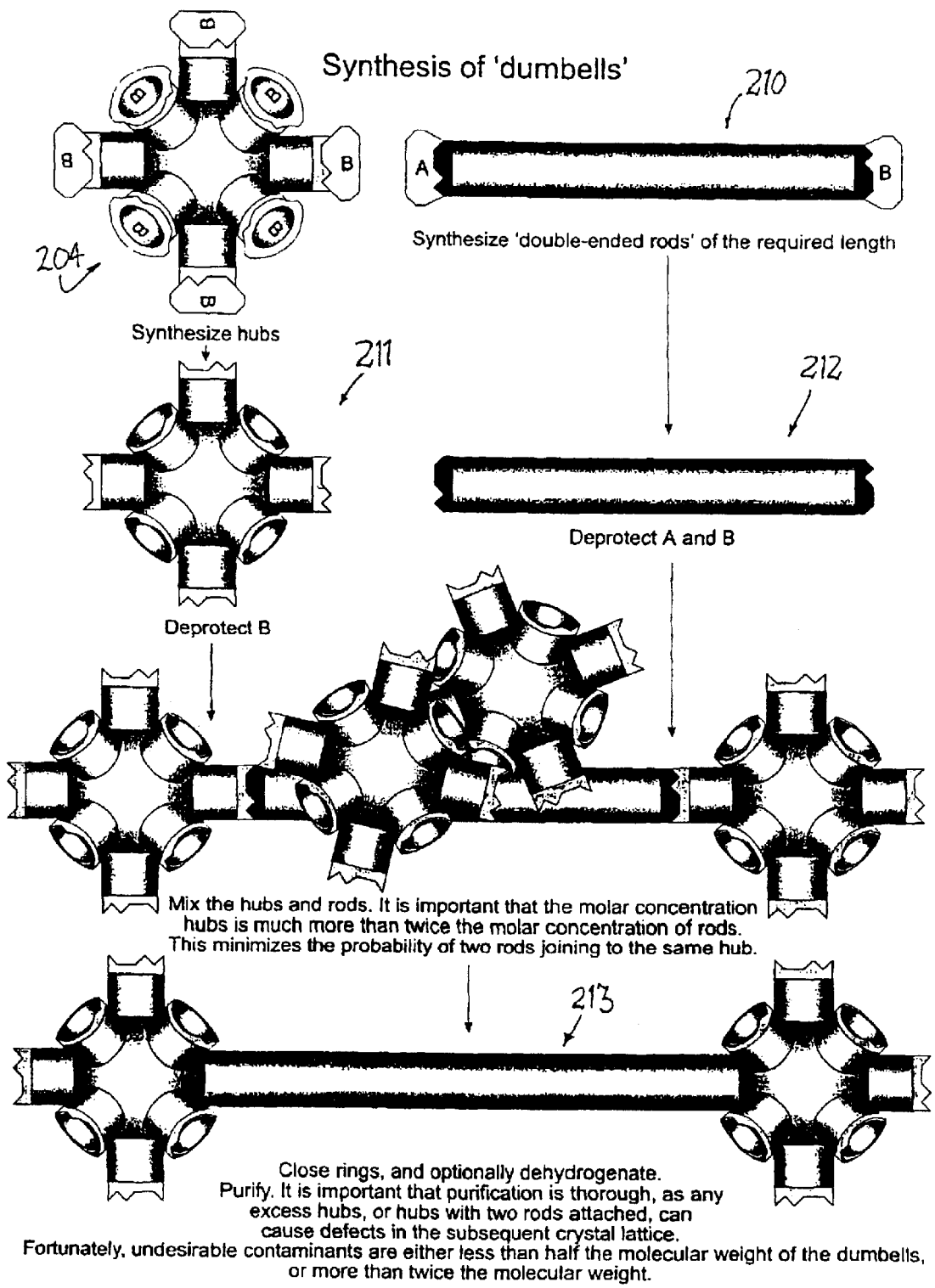
FIG. 34 illustrates the dumbell' synthesis process.

Next, "dumbell" units can be formed using the process as illustrated in FIG. 34. The dumbell units are formed through providing a mixture of synthesised hubs 204 and double ended rods 210 utilizing the synthesis indicated.

The ends of each of the hubs and rods are de-protected 210,212. A mixture of hubs and rods is provided whereby the molar concentration the molar concentration of rods. This minimises the probability of two rods joining the same hub.

Subsequently, a reagent is added to close the rings and optional dehydrogenation is carried out followed by purification so as to provide for a collection of purified dumbell units 213.

Figure 35:
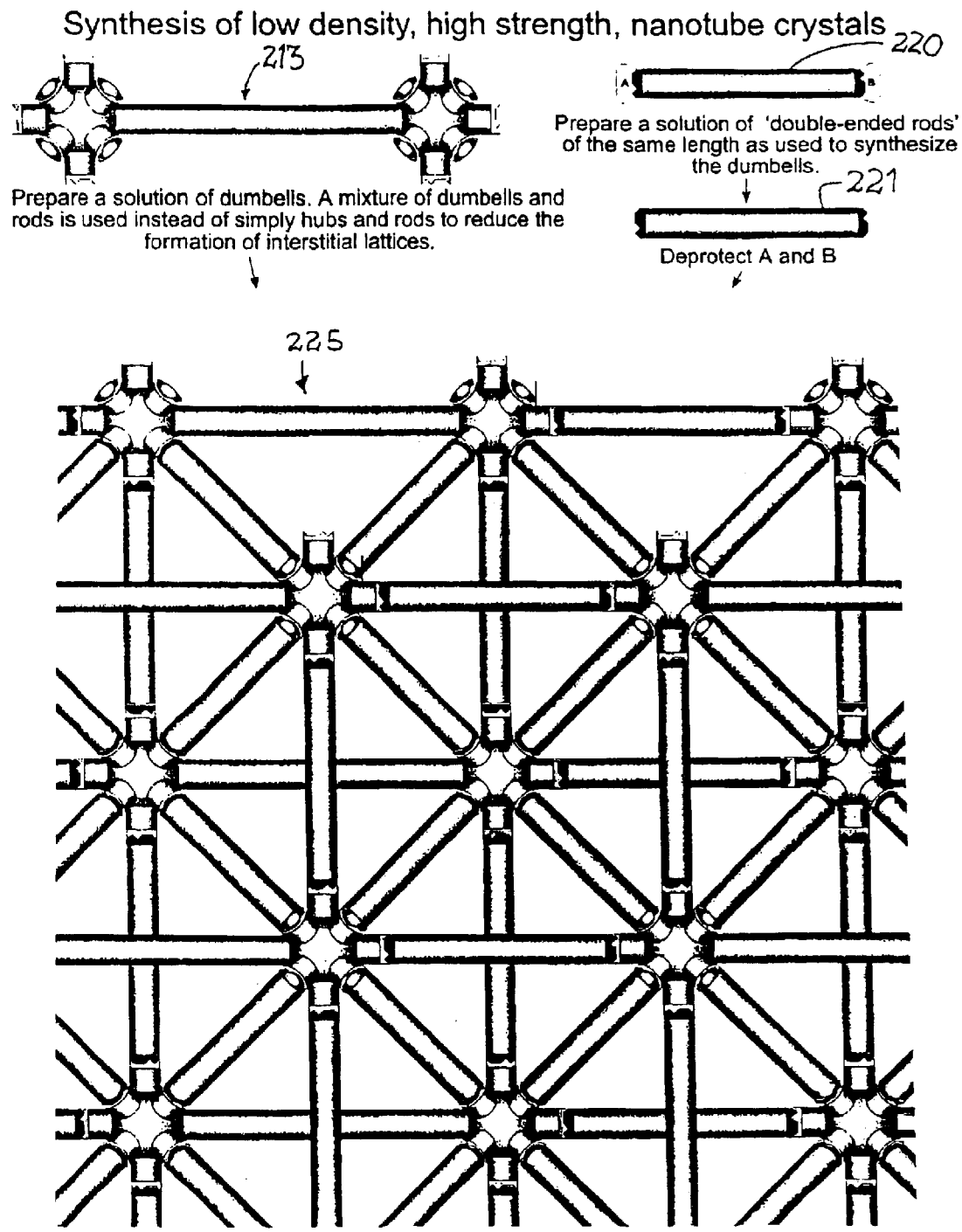
FIG. 35 illustrates an alternative process for forming a nanotube crystal.

Turning now to FIG. 35, there is illustrated the steps required in the synthesis of a low density high strength nanotube crystal which can be synthesized from dumbell components 213 (of FIG. 34) in addition to a series of double ended rods 220 which are deprotected 221 and added in solution with the double units 213. The mixture of dumbells and rods is accurately controlled in a molar ratio of 11 rods to each dumbell. A face centred cubic crystal of nanotube lattice may be created in a process analogous to Czochralski crystal growing. In this case, nanotube dumbells and rods are analogous to the atoms in Czochralski crystal growth. The nanotube solution is heated from below to a temperature which is slightly above the hydrogen bond disassociation temperature. A seed crystal is lowered into this solution and slowly pulled out.

Nanotubes are crystallised on the seed as the temperature falls at the melt interface in the process of pulling the crystal. The seed is preferably rotated so that the nanotubes of orthogonal orientation are not preferentially depleted in the "melt". The lattice drains of solvent as the crystal is pulled. In an alternative arrangement an initial seed can be generated by patterning a planer surface with dumbell attracting spots at the same pitch as the crystal lattice.

After the crystal is pulled it can be lowered into clean solvent which contains a ring closing reagent and a dehydrogenation catalyst. Since all hydrogen bonds have been replaced by covalent bonds, and dehydrogenated, the structure is fully aromatic and achieves its full strength.

The final structure being illustrated 225.

It will be evident that the forgoing teachings in the construction of large mesh structures can be readily modified in many way whilst still falling within the spirit and scope of the present invention.

For example, a matrix structure having predetermined electrical devices can be constructed by forming the electrical components and substituting the components at predetermined points of the mixing and annealing process.

It will be further evident that the annealing process can also be utilized in the creation of other complex interlinked structures.

Figure 36:
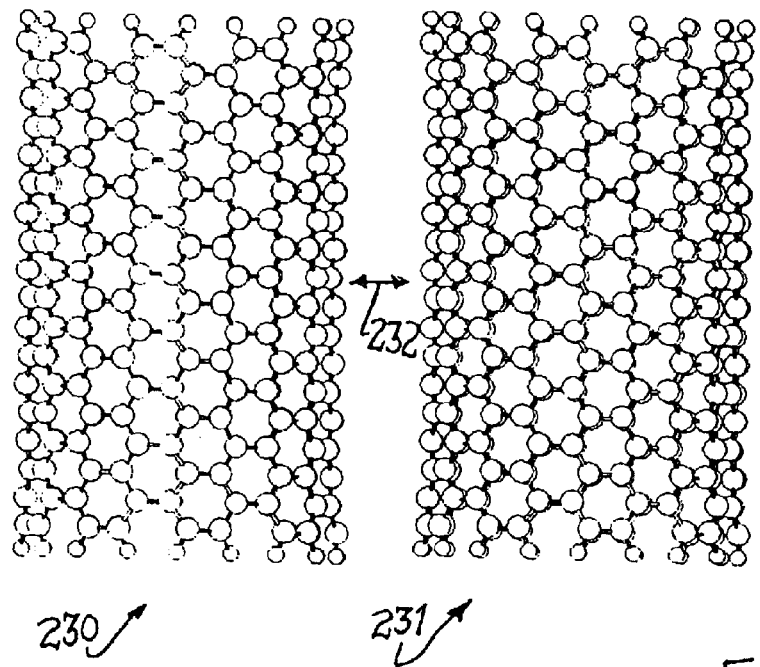
FIG. 36 illustrates the problem of nanotube-nanotube attraction.

Further, the nanotube rod components utilized in forming structures can include a number of refinements. In particular, due to the interaction of Van der Waals attractive forces in solution, the nanotube components themselves may exhibit a high degree of attractiveness between components. Such a situation is illustrated in FIG. 36 with the nanotube fragments 230 and 231 exhibiting a high attractiveness which can lead to the formation of intertwined strands of nanotube components.

Figure 37:
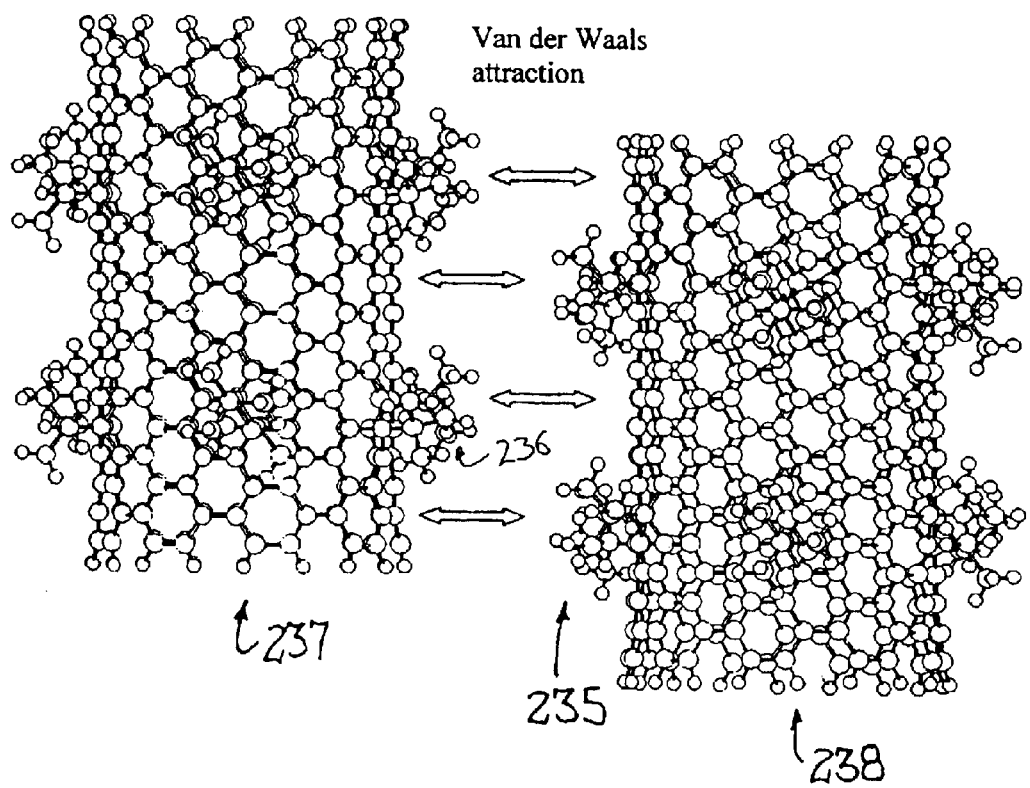
FIG. 37 illustrates a modified form of nanotube.

One form of reduction of the effect of Van Der Walls attraction is shown in FIG. 37 wherein a series of methane groupings e.g. 235,236 are formed on the outer walls of the nanotubes so as to provide for a reduction in the opportunity for Van der Walls interaction between the tubes 237,238.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

What is claim is:

1. An electrical device having controlled properties comprising:
   a central nanotube of a zigzag type interconnected between two nanotubes of an armchair type.

2. An electrical device according to claim 1, the electrical device having controlled resistive properties, the central nanotube having a predetermined length.

3. An electrical device according to claim 1, the electrical device having signal amplification properties and comprising:
   field application means for applying a field to said central nanotube, thereby altering the conductive path between said armchair type nanotubes.

4. An electrical device according to claim 1, the electrical device having signal amplification properties and comprising:
   a control nanotube of a zigzag type interconnect to said central nanotube, said control nanotube being interconnected to a field application means for applying a voltage to said central nanotube, thereby altering the conductive path between said armchair type nanotubes.

5. An electrical device comprising a series of nanotubes interconnected at a common junction, said nanotubes, at said junction, comprising zigzag nanotubes, and a predetermined number of said nanotubes comprising a circumferential join to an armchair type nanotube so as to provide for the operational characteristics of said device.

6. An electrical device as claimed in claim 5, wherein at least one of said armchair type nanotubes are further interconnected to a common junction of armchair type nanotubes.

7. An electrical device comprising a series of armchair type nanotubes interconnected to a common junction.

8. An electrical device comprising the interconnection of a labyrinth of nanotube devices via common junctions, said devices comprising a series of diode elements formed from the interconnection of nanotubes of different dimensions.

9. An electrical device comprising a quantum well structure comprising the junction of a series of metallic type nanotube structures attached to a semiconductive nanotube so that electrons are substantially captured in said junction.

10. An electric device comprising a ballistic electron nanotube device comprising a nanotube junction with at least one quantum well structure adjacent the junction.

11. A method of forming an electrical device having controlled properties, the method comprising:
   connecting a first end of a zig-zag type nanotube to an end of an armchair type nanotube; and
   connecting a second end of the zig-zag type nanotube to an end of a second armchair type nanotube.

12. A method according to claim 11, the method of connecting a first end of the zig-zag type nanotube to a first end of an armchair type nanotube comprising:

synthsising armchair and zig-zag type nanotubes;

de-protecting a first end of the armchair and zig-zag type nanotubes; and interconnecting the de-protected ends of the zig-zag and armchair type nanotubes.

13. A method according to claim 12, the method of interconnecting the de-protected ends comprising the steps of:

(a) bringing a series of zig-zag and armchair type nanotubes together in a collation;

(b) agitating a first collation to an average energy exceeding a first intermediate binding potential energy;

(c) slowly lowering said average energy to a level substantially at said first intermediate binding potential energy;

(d) introducing a catalytic element to said collation to cause said de-protected ends to bind at a substantially lower second potential energy.

14. A method as claimed in claim 13, the method further comprising:

iteratively repeating steps (a) to (d).

15. A method as claimed in claim 14 wherein said first intermediate binding potential energy comprise substantially hydrogen bonding of said de-protected ends and said second lower potential energy comprises covalent bonding of said de-protected ends.

16. A method as claimed in claim 11 wherein said agitating step comprises heating or ultrasonically agitating said collation.

* * * * *